(12) United States Patent
Chuang

(10) Patent No.: US 11,876,064 B2
(45) Date of Patent: Jan. 16, 2024

(54) SEMICONDUCTOR STRUCTURE AND MANUFACTURING METHOD THEREOF

(71) Applicant: ChangXin Memory Technologies, Inc., Hefei (CN)

(72) Inventor: Ling-Yi Chuang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 260 days.

(21) Appl. No.: 17/429,305

(22) PCT Filed: Jun. 15, 2020

(86) PCT No.: PCT/CN2020/096089
§ 371 (c)(1),
(2) Date: Aug. 6, 2021

(87) PCT Pub. No.: WO2021/103490
PCT Pub. Date: Jun. 3, 2021

(65) Prior Publication Data
US 2022/0148990 A1 May 12, 2022

(30) Foreign Application Priority Data

Nov. 29, 2019 (CN) .......................... 201911205208.6

(51) Int. Cl.
*H01L 23/00* (2006.01)
(52) U.S. Cl.
CPC .............. *H01L 24/13* (2013.01); *H01L 24/11* (2013.01); *H01L 24/27* (2013.01); *H01L 24/29* (2013.01);
(Continued)

(58) Field of Classification Search
CPC ....................................................... H01L 24/13
See application file for complete search history.

(56) References Cited

U.S. PATENT DOCUMENTS 10,163,827 B1 * 12/2018 Tsao ........................ H01L 24/13

FOREIGN PATENT DOCUMENTS

CN 101728347 A 6/2010
CN 103489844 A 1/2014
(Continued)

OTHER PUBLICATIONS

PCT/CN2020/096089 International Search Report dated Sep. 18, 2020, English Translation.

*Primary Examiner* — William A Harriston
(74) *Attorney, Agent, or Firm* — Alston & Bird LLP

(57) ABSTRACT

A semiconductor structure and a manufacturing method thereof are disclosed. The semiconductor structure includes a semiconductor substrate, a metal pad, a bump, a metal barrier layer, and a solder layer. The metal pad is arranged on the semiconductor substrate; the bump is arranged on the metal pad; the metal barrier layer is arranged on the side of the bump away from the metal pad; the metal barrier layer contains a storage cavity; the sidewall of the metal barrier layer is configured with an opening connecting to the storage cavity; the solder layer is arranged inside the storage cavity, and the top side of the solder layer protrudes from the upper side of storage cavity. During the flip-chip soldering process, solder is heated to overflow, the opening allows the solder flow out through the opening. The openings achieve good solder diversion in overflow, thus mitigating the problem of solder bridging between bumps.

18 Claims, 21 Drawing Sheets

(52) U.S. Cl.
CPC ............... *H01L 2224/1147* (2013.01); *H01L 2224/11622* (2013.01); *H01L 2224/13005* (2013.01); *H01L 2224/2745* (2013.01); *H01L 2224/2902* (2013.01)

(56) References Cited

FOREIGN PATENT DOCUMENTS

| | | |
|---|---|---|
| CN | 105374775 A | 3/2016 |
| CN | 209119091 U | 7/2019 |
| CN | 210640230 U | 5/2020 |
| WO | WO 2021/103490 A1 | 6/2021 |

* cited by examiner

SEMICONDUCTOR STRUCTURE AND MANUFACTURING METHOD THEREOF

CROSS REFERENCES TO RELATED APPLICATIONS

This application claims the benefit of priority to CN Patent Application CN 201911205208.6 filed on Nov. 29, 2019, entitled "Semiconductor Structure and Manufacturing Method Thereof" the contents of which are incorporated herein by reference in its entirety.

TECHNICAL FIELD

The present disclosure relates to the field of semiconductor chip technology, and in particular to a semiconductor chip structure and a manufacturing method thereof.

BACKGROUND

As integration level, functions, and performance of integrated circuits become higher, and new types of integrated circuits appear, packaging technologies have been playing an increasingly important role in integrated circuit products, and their value have taken higher share in the entire electronic system. Among them the bumping interconnect technology, with its good electrical performance and resistance to electromigration, has become a key technology for the next generation of chip narrow-pitch interconnection.

In the related arts, during the flip-chip soldering process, the package substrate can be deformed when it is heated, the chip and the substrate may have a flatness difference, compression in certain semiconductor chip structures occurs, resulting in solder overflow and solder bridging between bumps.

SUMMARY

The present disclosure overcomes at least one of the above-mentioned drawbacks of the current arts and provide sa semiconductor structure and a manufacturing method thereof.

According to the first aspect of the present invention, a semiconductor structure is provided which includes: a semiconductor substrate; a metal pad disposed on the semiconductor substrate; a bump disposed on the metal pad; a metal barrier layer disposed on a side of the bump away from the metal pad, wherein the metal barrier layer comprises a storage cavity and at least one opening, wherein the at least one opening is placed on a side wall of the metal barrier layer, and wherein the at least one opening is connected to the storage cavity; and a solder layer disposed in the storage cavity, wherein one side of the solder layer away from the bump protrudes from the storage cavity.

In some examples, the storage cavity is a through hole so that the solder layer is in contact with the bump.

In some examples, the at least one opening extends along a length of the metal barrier layer and intersects both ends of the metal barrier layer. In some examples, the at least one opening comprises multiple openings, and wherein the multiple openings are spaced apart with an interval from each other.

In some examples, the metal barrier layer comprises: side wall segments, wherein the side wall segments are arranged in pairs, wherein the pair of side wall segments are arranged to be apart from each other on the bump, and wherein two openings are formed between two oppositely placed side wall segments; and a connecting section, both ends of the connecting section are respectively connected to the two oppositely placed side wall sections.

In some examples, the connecting section connects to a middle part of each of the two oppositely placed sidewall sections.

In some examples, the solder layer comprises: a first solder layer, wherein the first solder layer is disposed on the bump and located below the connecting section; and a second solder layer, wherein the second solder layer is disposed on the first solder layer, wherein a side of the second solder layer away from the first solder layer protrudes from the storage cavity; wherein the second solder layer is in contact with the first solder layer, and wherein the connecting section of the metal barrier layer is located between the first solder layer and the second solder layer.

In some examples, the solder layer is disposed in the opening.

In some examples, the bump is a copper pillar, and the semiconductor structure further comprises: an under-bump metal layer, at least a part of the under-bump metal layer is sandwiched between the metal pad and the bump.

In some examples, the semiconductor structure further comprises: a first protection layer disposed on the semiconductor substrate, wherein the first protection layer has a first opening, and wherein the first opening exposes a part of the metal pad.

In some examples, the semiconductor structure further comprises: a second protective layer disposed on the first protective layer, wherein the second protective layer comprises a second opening, and wherein a size of the second opening is smaller than or equal to a size of the first opening; wherein the under-bump metal layer at least covers a bottom surface and a sidewall surface of the second opening, and wherein at least part of the under-bump metal layer is disposed in the second opening.

According to another embodiment of the disclosure, a method of manufacturing a semiconductor structure comprises: providing a semiconductor substrate, and forming a metal pad on the semiconductor substrate; forming a bump on the metal pad; and forming a solder layer and a metal barrier layer on a side of the bump away from the metal pad; wherein the metal barrier layer comprises a storage cavity, wherein a side wall of the metal barrier layer is provided with an opening, wherein the opening connects to the storage cavity, wherein the solder layer is disposed in the storage cavity, and wherein one surface of the solder layer away from the bump protrudes from the storage cavity.

In some examples, before forming the bump, the manufacturing method further comprises: forming an under-bump metal layer on the metal pad; wherein, at least part of the under-bump metal layer is sandwiched between the metal pad and the bump.

In some examples, before forming the bump, the manufacturing method further comprises: forming a first protective layer on the semiconductor substrate; wherein the first protection layer comprises a first opening, and wherein the first opening exposes a part of the metal pad.

In some examples, after forming the first protective layer, the manufacturing method further comprises: forming a second protective layer on the upper surface of the first protective layer and the metal pad; and after forming the second protection layer, forming the under-bump metal layer on the metal pad and the second protection layer; wherein the second protective layer comprises a second opening, wherein a size of the second opening is smaller than or equal to a size of the first opening, wherein the under-bump metal layer covers at least a bottom surface and a sidewall surface of the second opening, and wherein at least a part of the under-bump metal layer is disposed in the second opening.

In some examples, the solder layer comprises a first solder layer and a second solder layer, wherein a method forming the first solder layer and the second solder layer comprises: forming a first solder layer on a side of the bump away from the metal pad; forming the metal barrier layer on the first solder layer and the bumps; and forming the second solder layer in the storage cavity.

In some examples, before forming the bump, the manufacturing method further comprises: forming a first photoresist layer on the semiconductor substrate in an area not aligned to the bump and the first solder layer; and after forming the bump and the first solder layer, removing the first photoresist layer.

In some examples, the method further comprises, before forming the metal barrier layer: forming a first mask layer on a side of the semiconductor substrate wherein the first solder layer is formed; applying a photolithography process to pattern the first mask layer to expose a part of the first solder layer; etching the first solder layer with a chemical acid etching process to expose the bump; removing the first mask layer; forming a second mask layer; and applying a photolithography process to pattern the second mask layer to expose the first solder layer and a part of the bump, and disposing the metal barrier layer on the first solder layer, the bump, and the second mask layer, wherein the metal barrier layer covers a portion of the first solder layer.

In some examples, further comprising, after forming the metal barrier layer; forming a second photoresist layer on the metal barrier layer in an area aligned to the bump; patterning the metal barrier layer in an area not covered by the second photoresist layer; removing the second photoresist layer; filling the storage cavity with solder to form the second solder layer, wherein the first solder layer is in contact with the second solder layer, and wherein the metal barrier layer is disposed in the second solder layer; and removing the second mask layer.

In some examples, further comprising, after forming the metal barrier layer; forming a third photoresist layer on the metal barrier layer in an area not aligned to the bump; filling the storage cavity with solder to form the second solder layer, wherein the first solder layer is in contact with the second solder layer, and wherein a part of the metal barrier layer is disposed in the second solder layer; removing the third photoresist layer, etching the metal barrier layer in an area not covered by solder; and removing the second mask layer.

The semiconductor structure of the present invention includes a semiconductor substrate, a metal pad, a bump, a solder layer and a metal barrier layer. The solder layer is arranged in the storage cavity, and the sidewalls of the metal barrier layer contains openings. Because of the existence of the openings, during the flip-chip soldering process, solder overflows after being heated and may flow out of the openings, that is, the openings play a role of diversion, so that the diversion of the solder can be controlled guided by the orientation of the openings, thereby mitigating the problem of solder bridging between bumps.

BRIEF DESCRIPTION OF THE DRAWINGS

By considering the following detailed description of the preferred embodiments of the present disclosure in conjunction with the accompanying drawings, various objectives, features and advantages of the present disclosure will become more apparent. The drawings are merely exemplary illustrations of the present disclosure and are not necessarily drawn to scale. In the drawings, the same reference signs always indicate the same or similar parts, among them.

Figure 1:
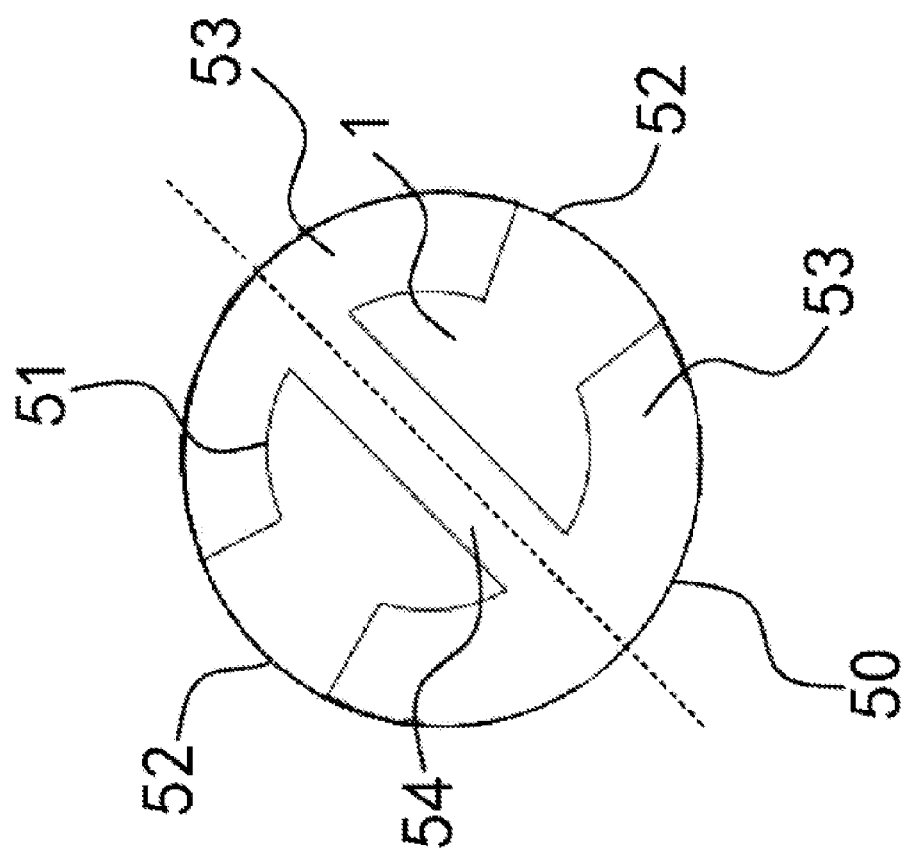
FIG. 1 shows a top view showing a first form of a semiconductor structure according to an exemplary embodiment.

The reference numerals are explained as follows:

1. solder layer; 10, metal pad; 11. first photoresist layer; 12, first mask layer; 13, second mask layer; 14, second photoresist layer; 20, semiconductor substrate; 30, bump; 40, first solder layer; 41, removal space; 50, metal barrier layer; 51, storage cavity; 52, opening; 53, side wall section; 54, connection section; 60, second solder layer; 70. under bump metal layer; 80. a first protective layer; and 90, a second protective layer.

DETAILED DESCRIPTION OF THE PREFERRED EMBODIMENTS

The embodiments of the features and advantages of the present disclosure will be described in detail in the following description. It should be understood that the present disclosure can have various characteristics in different embodiments, which do not depart from the scope of the present disclosure, and the description and drawings therein are essentially for illustrative purposes, rather than limiting the present disclosure.

In the following description of the different exemplary embodiments of the present disclosure, reference is made to the accompanying drawings, which form a part of the present disclosure, and therein are shown by way of different exemplary structures, systems, and steps that can implement various aspects of the present disclosure. It should be understood that other specific solutions of components, structures, exemplary devices, systems, and steps can be used, and structural and functional modifications can be made without departing from the scope of the present disclosure. Moreover, although the terms "above", "between". "within", etc. may be used in this specification to describe different exemplary features and elements of the present disclosure, these terms are used herein for convenience only, such as the directions of the items in the drawings. Nothing in this specification should be understood as requiring a specific three-dimensional structure to fall within the scope of the present disclosure.

An embodiment of the present invention provides a semiconductor chip structure. Please refer to FIGS. 1 to 6. The semiconductor chip structure includes: a semiconductor substrate 20; a metal pad 10 disposed on the semiconductor substrate 20; and a bump 30 arranged on the metal pad 10; a metal barrier layer 50 is disposed on the side of the bump 30 away from the metal pad 10, the metal barrier layer 50 has a storage cavity 51, the side wall of the metal barrier layer 50 is provided with an opening 52. the opening 52 and the storage cavity 51 are next to each other; the solder layer 1 is arranged in the storage cavity 51, and the top end of the solder layer 1 away from the bump 30 protrudes from the storage cavity 51.

The semiconductor chip structure according to an embodiment of the present invention is composed of a semiconductor substrate 20, a metal pad 10, a bump 30, a solder layer 1, and a metal barrier layer 50. The solder layer 1 is disposed in the storage cavity 51 and the sidewall of the metal barrier layer 50 has an opening 52 located on the upper part of the sidewall of the metal barrier layer 50. During the flip-chip soldering process, the solder is heated to overflow out through the opening 52, that is, the opening 52 functions as a flow guide. Therefore, through design and control of the opening 52, the diversion effect of the solder can be realized, thereby improving the problem of solder bridging between the bumps.

In one embodiment, since the solder layer 1 is disposed in the storage cavity 51, there is a certain restriction on the outflow of the solder, and the flow direction is controlled through the opening 52, which reduces the convexity caused by the warping of the package substrate after heating. The problem of solder bridging between blocks is mitigated and the yield is improved.

In one embodiment, the storage cavity 51 is a through hole, so that the solder layer 1 is in direct contact with the bump 30. Both top and bottom ends of the storage cavity 51 are open ends, and the opening 52 is also an open hole on the side wall of the storage cavity 51.

In one embodiment, the opening 52 extends along the axial length of the metal barrier layer 50 and intersects both top and bottom ends of the metal barrier layer 50. The opening 52 separates the metal barrier layer 50. For example, when the metal barrier layer 50 is a cylinder, the opening 52 is a notch cut out on the top surface of the cylinder, and the gaps on the side wall penetrate to both ends of the metal barrier layer 50.

In one embodiment, there are multiple openings 52, and the multiple openings 52 are arranged at intervals from the adjacent ones.

In one embodiment, there is only one opening 52.

In one embodiment, as shown in FIG. 1, the metal barrier layer 50 includes: side wall sections 53, the side wall sections 53 are arranged in pairs, and the pair of two side wall sections 53 are spaced apart on the top surface of the bump 30, opposite to each other. Two openings 52 are formed between the two side wall sections 53; the connecting section 54 is bridging the two side wall sections 53 at both ends respectively.

In one embodiment, the connecting section 54 is designed to end at the middle parts of the two side wall sections 53. The connection section 54 strengthens the stability of the side wall section 53.

Figure 4:
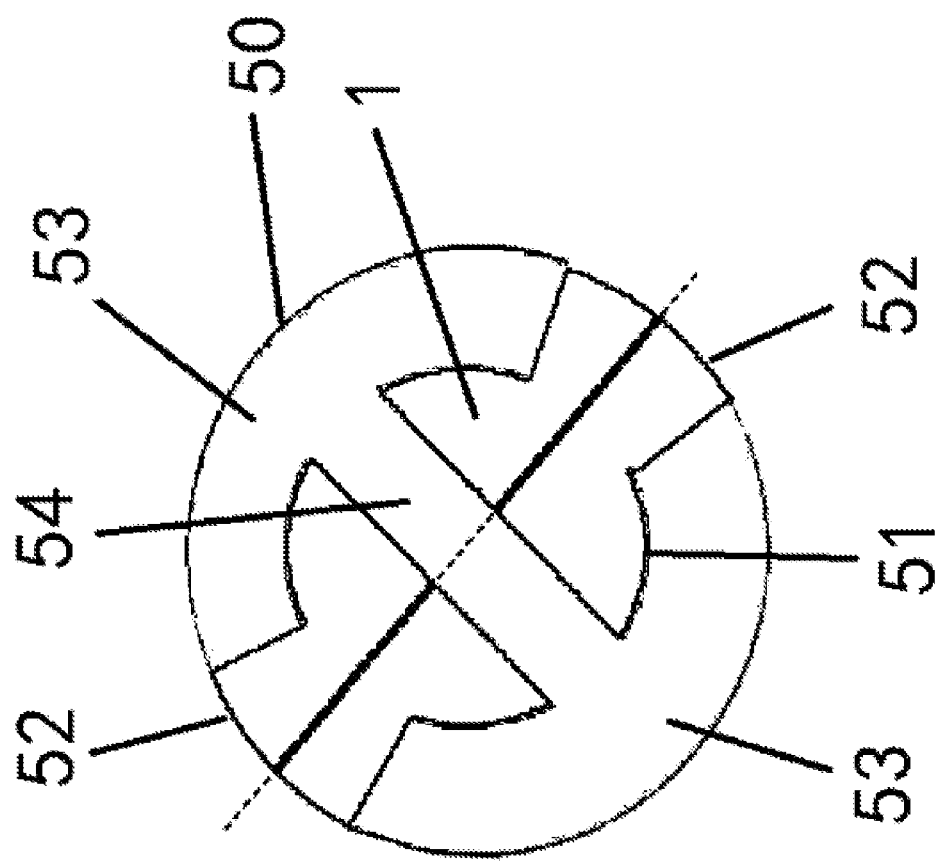
FIG. 4 shows a top view showing a second form of a semiconductor structure according to an exemplary embodiment.
Figure 5:
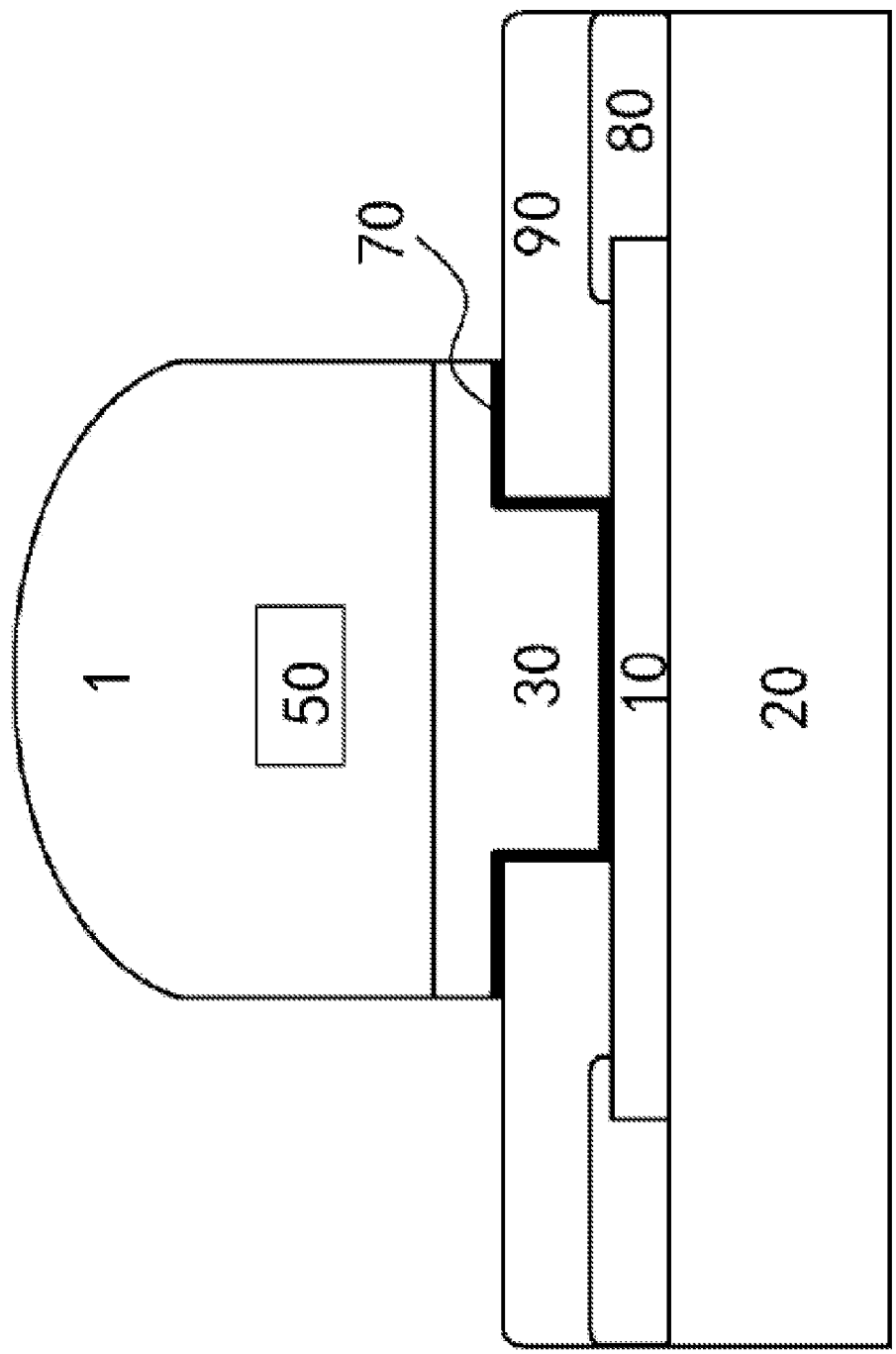
FIG. 5 shows a schematic cross-sectional diagram of the semiconductor structure in FIG. 4 according to an exemplary embodiment.
Figure 6:
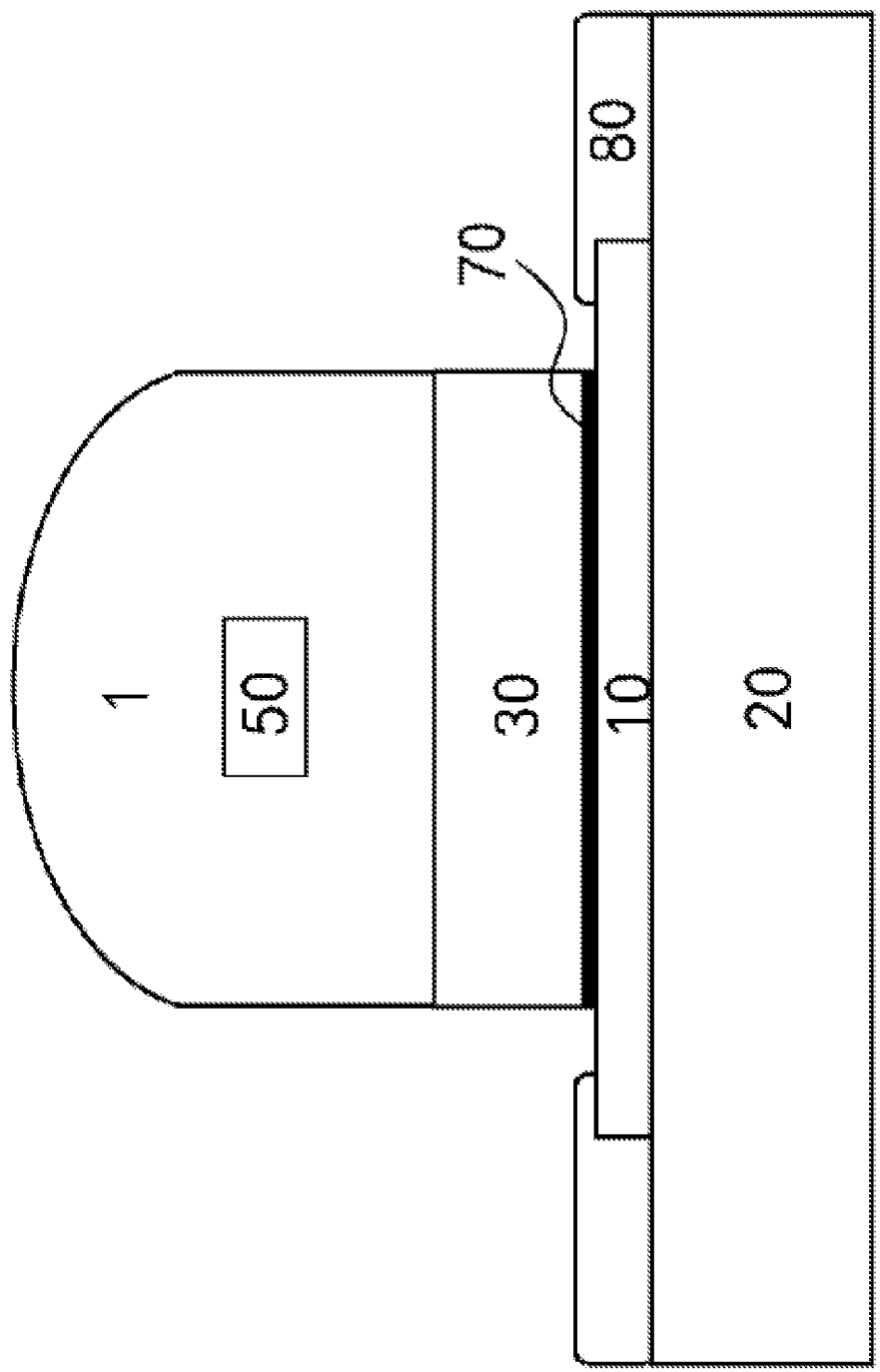
FIG. 6 shows a schematic cross-sectional diagram of the semiconductor structure in FIG. 4 according to another exemplary embodiment.

As shown in FIG. 1, the metal barrier layer 50 is composed of a pair of two side wall sections 53 and a connecting section 54. The length direction of the connecting section 54 is the cross sectional cut line (that is, the line connecting the two side wall sections 53). There are two different structural embodiments in FIG. 2 and FIG. 3. FIG. 1 shows the arrangement between the metal barrier layer 50 and the solder layer 1, where the solder layer 1 is disposed in the metal barrier layer 50 and fills in the storage cavity 51 as well as the opening 52 in the metal barrier layer 50. As shown in FIG. 4, the metal barrier layer 50 has a pair of two sidewall sections 53 and a connecting section 54. In this case, the width direction of the connecting section 54 is the cross sectional cut line (where the line connecting the two opposite openings 52). FIG. 5 and FIG. 6 show the two different structural embodiments from this cross sectional cut line. From FIG. 5 and FIG. 6, the connecting section 54 connects the two sidewall sections 53, and the connecting section 54 is arranged inside the solder layer 1.

In one embodiment, the solder layer 1 includes: a first solder layer 40, the first solder layer 40 is disposed on the bump 30, and is located below the connecting section 54; the second solder layer 60, the second solder layer 60 is disposed on the first solder layer 40, and the end of the second solder layer 60 away from the first solder layer 40 protrudes from the storage cavity 51; wherein, the second solder layer 60 is in contact with the first solder layer 40, and the connecting section 54 is provided on the first solder layer between the solder layer 40 and the second solder layer 60.

In one embodiment, the connecting section 54 is embedded in the first solder layer 40, or the connecting section 54 is embedded in the second solder layer 60, or a part of the connecting section 54 is located in the first solder layer 40, and the other part is located in the second solder layer 60.

In one embodiment, the solder layer 1 fills the opening 52.

In one embodiment, the metal barrier layer 50 only includes sidewall sections 53, that is, there is no connecting structure in the middle of the sidewall sections. It can be understood that the metal barrier layer 50 is a columnar structure with openings at the upper and lower ends, and openings on the sidewalls.

In one embodiment, a solder layer 1 fills in the storage cavity 51.

In an embodiment, the first solder layer 40 and the second solder layer 60 each comprises one of solder metal lead, tin, and silver or an alloy containing any one of the foregoing solder metals. For example, the material of the first solder layer 40 and/or the second solder layer 60 may be an alloy with a tin content of 91.5% to 98.5% and a silver content of 8.5% to 1.5%. Optionally, the material of the first solder layer 40 and/or the second solder layer 60 may be an alloy with a tin content of 93.2% to 96.5% and a silver content of 6.8% to 3.5%, the material of the first solder layer 40 and/or the second solder layer 60 may be an alloy with a tin content of 98.2% to 98.5% and a silver content of 1.8% to 1.5%.

In one embodiment, the semiconductor base 20 includes a semiconductor substrate and a number of integrated circuits (IC) and insulating layers. The material of the metal pad 10 may be aluminum or copper, but is not limited thereto.

In one embodiment, the cross section of the metal barrier layer 50 is H-shaped. The metal barrier layer 50 is designed to have two arc-shaped sections and a rectangular section from a top view. The rectangular section connects the two arc-shaped sections, and the second solder layer 60 and the first solder layer 40 placed in the rectangular section are in contact with each other.

In one embodiment, the material of the metal barrier layer 50 may include nickel.

In one embodiment, the bump 30 is a copper pillar, and the semiconductor structure further includes: an under bump metal layer 70, at least part of the under bump metal layer 70 is sandwiched between the metal pad 10 and the bump 30. The metal material layer of the under-bump metal layer 70 may include a Ti layer, a TiW layer, and a Cu layer. The under-bump metal layer 70 is electrically connected to the metal pad 10. The under-bump metal layer 70 prevents the bump 30 from directly contacting the metal pad 10.

In one embodiment, the semiconductor structure further includes: a first protection layer 80 disposed on the semiconductor substrate 20, here the first protection layer 80 has a first opening, and the first opening exposes a portion of the metal pad 10, herein the first protection layer 80 covers the peripheral outer edge of the metal pad 10. Herein, the material of the first protection layer 80 may be one or a combination of silicon dioxide and silicon nitride.

In one embodiment, the first protective layer 80 covers a part of the metal pad 10 and a part of the semiconductor substrate 20 top surface outside the metal pad 10.

In one embodiment, the semiconductor structure further includes: a second protective layer 90 disposed on the first protective layer 80, the second protective layer 90 has a second opening, and the diameter of the second opening is smaller than or equal to the diameter of the first opening; Herein, the under-bump metal layer 70 covers at least the bottom surface and the sidewall surface of the second opening of the second protective layer 90, and at least part of the under-bump metal layer 70 is disposed in the second opening. The material of the second protective layer 90 may be polyimide.

In one embodiment, the under-bump metal layer 70 is disposed on a part of the second protection layer 90 and the exposed metal pad 10. In one embodiment, the under-bump metal layer 70 can enclose the bump 30, where the bump 30 is located in the open cavity formed by the under-bump metal layer 70, and the plane of the notch of the under-bump metal layer 70 shares the same plane as the bottom surface of the first solder layer 40.

Figure 2:
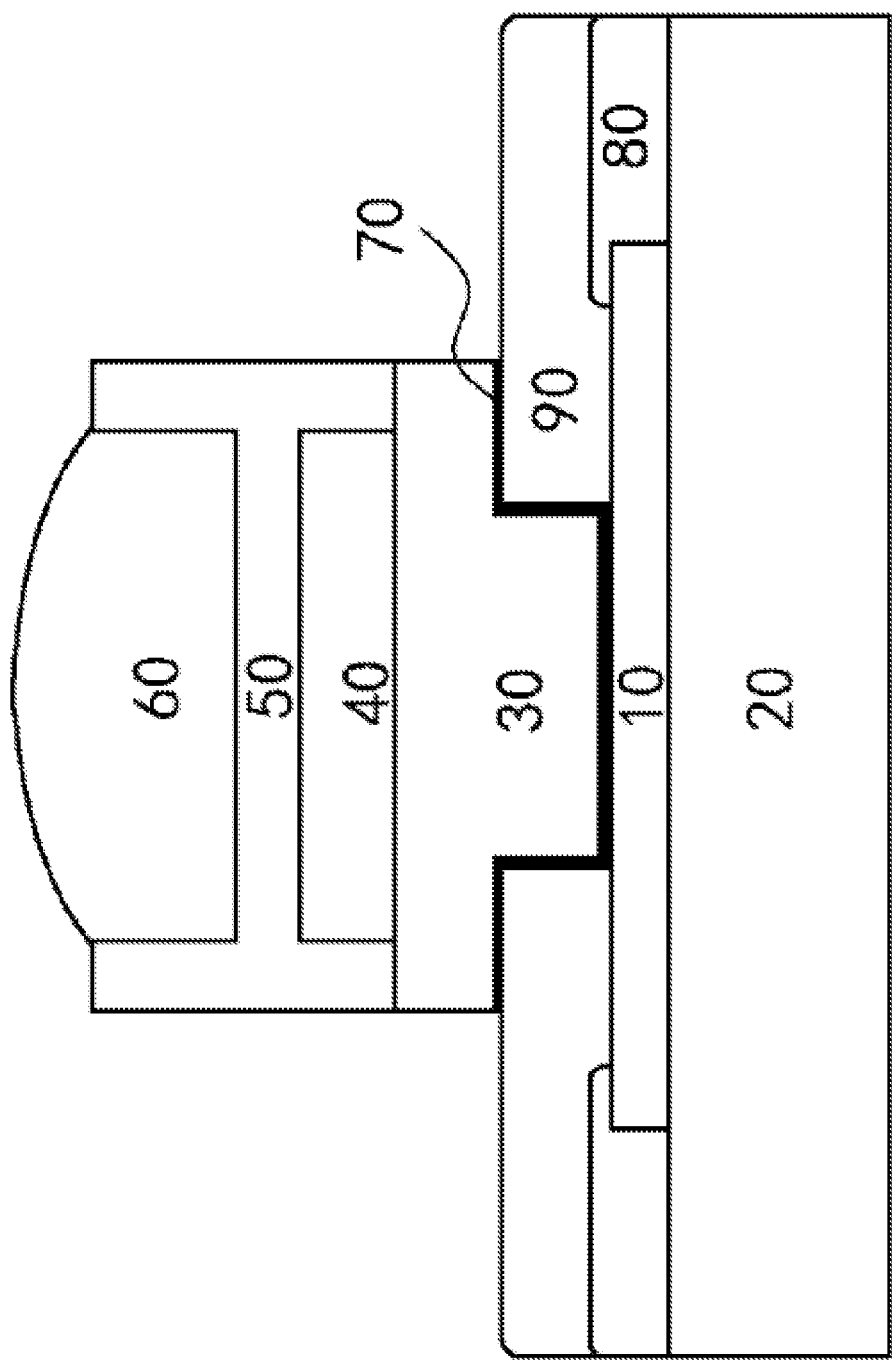
FIG. 2 shows a schematic cross-sectional diagram of the semiconductor structure in FIG. 1 according to the exemplary embodiment.

In one embodiment, as shown in FIGS. 2 and 5, the semiconductor structure includes a semiconductor substrate 20, a metal pad 10, a bump 30, a first solder layer 40, a metal barrier layer 50, a second solder layer 60, and the under-bump metal layer 70, the first protection layer 80 and the second protection layer 90. The first protection layer 80 covers the metal pad 10 and shields part of the metal pad 10. The second protection layer 90 is disposed on the first protective layer 80 and covers a part of the metal pad 10, here the second protective layer 90 and the first protective layer are integrated so the first protective layer is always under the second protective layer. The second protective layer 90 does not cover the middle of the metal pad 10. The under-bump metal layer 70 is deposited with the physical vapor deposition technique to arrange the Ti layer, the TiW layer, and the Cu layer on the second protective layer 90 and the metal pad 10, here the Ti layer adheres to and prevents the metal copper from diffusing into the semiconductor substrate 20 to cause device leaks, and the Cu layer forms the electroplated electrodes. The bump 30 has a T-shaped cross section, that is, the smaller end of the T-shape is located in the under-bump metal layer 70 recessed area and the larger end is located outside the under-bump metal layer 70 recessed area.

Figure 3:
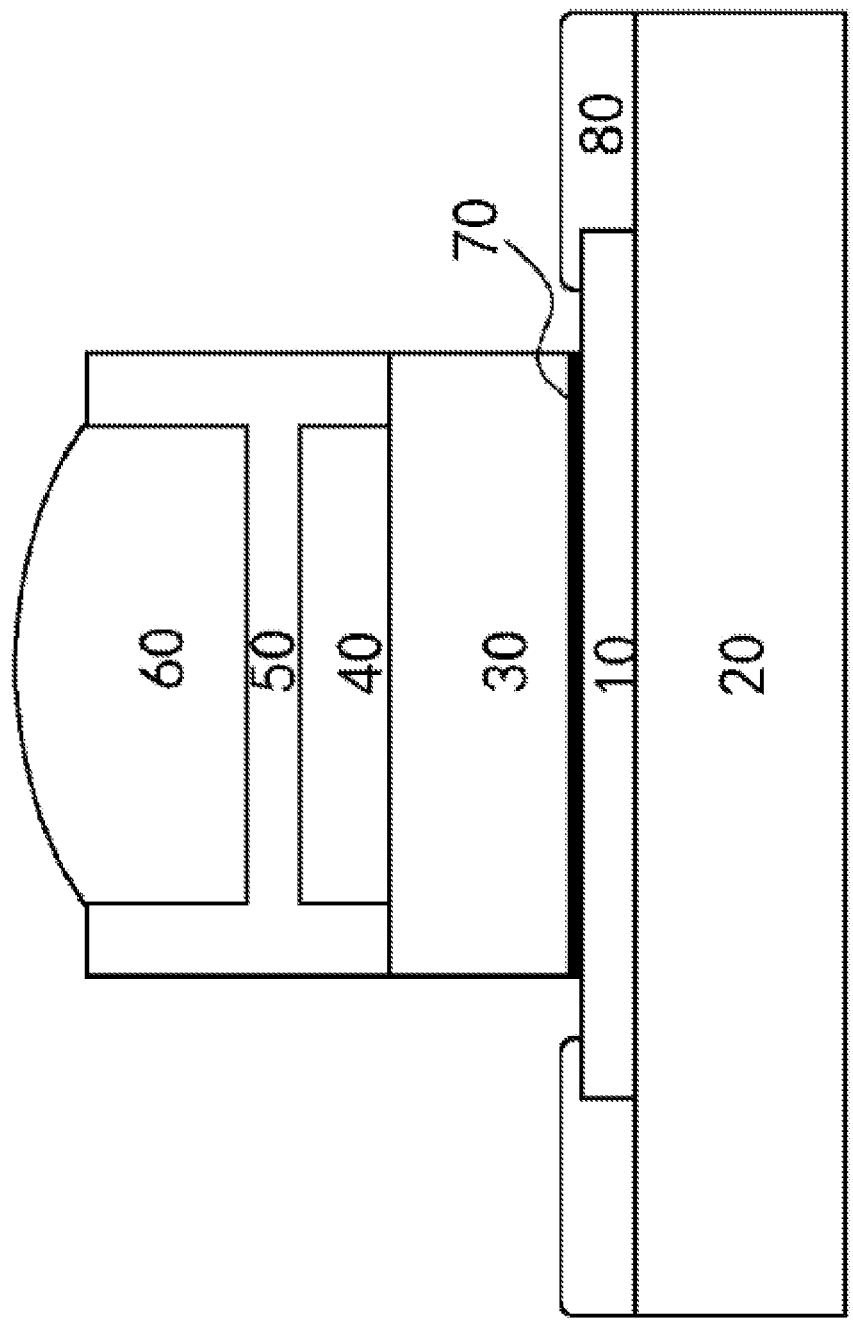
FIG. 3 shows a schematic cross-sectional diagram of the semiconductor structure in FIG. 1 according to another exemplary embodiment.

In another embodiment, as shown in FIGS. 3 and 6, the semiconductor structure includes a semiconductor substrate 20, a metal pad 10, a bump 30, a first solder layer 40, a metal barrier layer 50, a second solder layer 60, and an under-bump metal layer 70, a first protective layer 80. The first protective layer 80 covers the metal pad 10 and shields a part of the metal pad 10. The under-bump metal layer 70 includes metal material layers such as Ti layer, TiW layer, and Cu layer, which are disposed on the metal pad 10 by physical vapor deposition. Technique. The Ti layer adheres and prevents the metal copper from diffusing into the semiconductor substrate 20. The Cu layer forms the electroplated electrodes. The bump 30 has a rectangular cross section, and the bump 30 is located between the under-bump metal layer 70 and the first solder layer 40.

Figure 7:
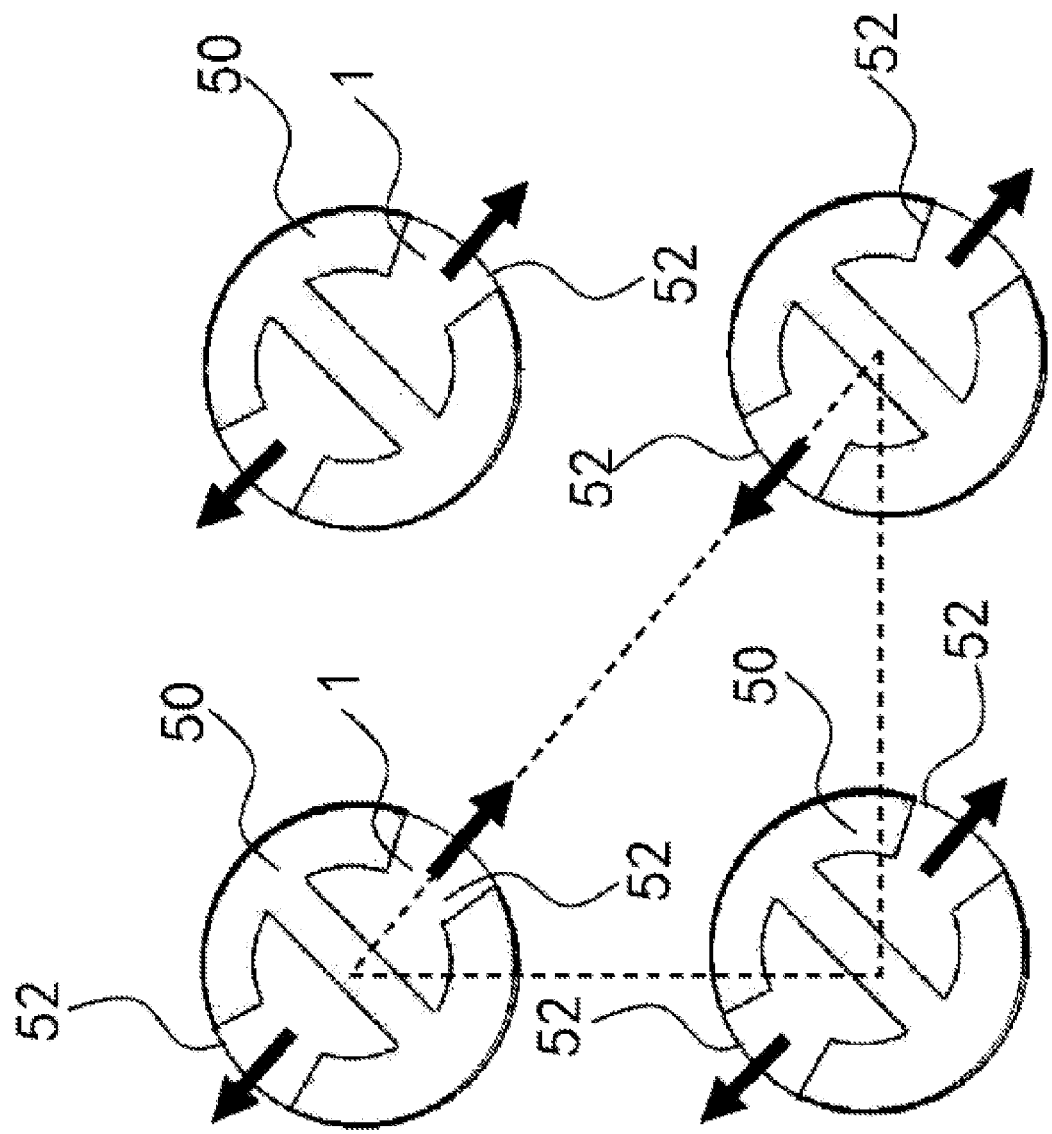
FIG. 7 shows a schematic diagram showing adjacent semiconductor structures according to an exemplary embodiment.
Figure 8:
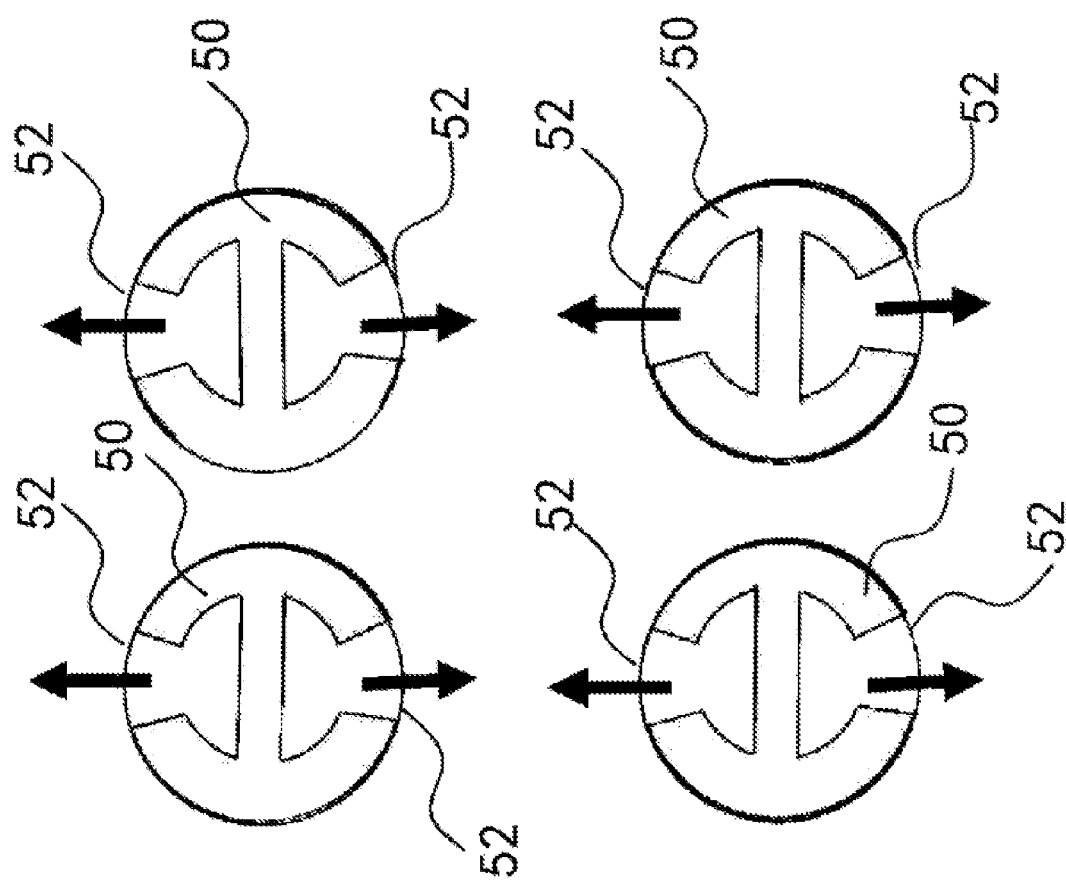
FIG. 8 shows a schematic diagram of adjacent semiconductor structures according to another exemplary embodiment.

In one embodiment, as shown in FIG. 7, the semiconductor structure can be designed with a 45-degree solder flow (a.k.a. tin flow) direction. Also as shown in FIG. 8, the direction of the tin flow can be designed between two adjacent yet farther-away-than-others bumps among the semiconductor structures. By controlling the direction of the tin flow, the design avoids from overflowing to the farthest adjacent bumps. By adjusting the direction of the opening 52, the distance between the bumps can also be reduced, so that more dense semiconductor circuit structures can be accommodated under the same chip area. The tin flow direction can be adjusted according to the specific design, and is not limited to the design schemes shown in FIG. 7 and FIG. 8.

An embodiment of the present invention also provides a method for manufacturing a semiconductor structure, including: providing a semiconductor substrate 20, and forming a metal pad 10 on the semiconductor substrate 20; forming a bump 30 on the metal pad 10; forming a solder layer 1 and a metal barrier layer 50 on one side of bump 30 away from the metal pad 10, wherein the metal barrier layer 50 includes a storage cavity 51, and an opening 52 is provided on the side wall of the metal barrier layer 50, and the opening 52 is connected to the storage cavity 51. The solder layer 1 is disposed in the storage cavity 51, and the top end of the solder layer 1 away from the bump 30 protrudes from the storage cavity 51.

In one embodiment, before forming the bump 30, the manufacturing method further includes: forming an under-bump metal layer 70 on the metal pad 10; where at least part of the under-bump metal layer 70 is sandwiched between the metal pad 10 and the bump 30.

In one embodiment, before forming the bump 30, the manufacturing method further includes: forming a first protective layer 80 on the semiconductor substrate 20, where the first protective layer 80 has a first opening, and the first opening exposes a part of the metal pad 10.

In one embodiment, after forming the first protective layer 80, the manufacturing method further includes: forming a second protective layer 90 on the upper surface of the first protective layer 80 and the metal pad 10; after forming the second protective layer 90, an under-bump metal layer 70 is formed on the metal pad 10 and the second protection layer 90, where the second protection layer 90 has a second opening, and the diameter of the second opening is smaller than or equal to the diameter of the first opening. The under-bump metal layer 70 covers at least the bottom surface and the sidewall surface of the second opening, and at least part of the under-bump metal layer 70 is disposed in the second opening.

In one embodiment, the solder layer 1 includes a first solder layer 40 and a second solder layer 60. The methods of forming the first solder layer 40 and the second solder layer 60 include: on the side of the bump 30 away from the metal pad 10, depositing a first solder layer 40, then forming a metal barrier layer 50 on the first solder layer 40 and the bump 30, followed by forming the second solder layer 60 in the storage cavity 51.

In one embodiment, before forming the bump 30, the manufacturing method further includes: forming the first photoresist layer 11 on the semiconductor substrate 20 at a portion other than the position corresponding to the bump 30 and the first solder layer 40; After the bump 30 and the first solder layer 40 are formed, the first photoresist layer 11 is removed.

In one embodiment, before forming the metal barrier layer 50, the manufacturing method further includes: forming a first mask layer 12 on the semiconductor substrate 20 including the first solder layer 40, applying a photolithography process to pattern the first mask layer 12 to expose part of the first solder layer 40, applying a chemical acid etching process to pattern the first solder layer 40 to expose a part of the bump 30, and then removing the first mask layer 12; forming the second mask layer 13 and patterning the second mask layer 13 lithographically to expose the first solder layer 40 and part of the bump 30, and forming a metal barrier layer 50 on the first solder layer 40, the bump 30 and the second mask layer 13. Herein, the metal barrier layer 50 covers a part of the first solder layer 40.

In one embodiment, after forming the metal barrier layer 50, the manufacturing method further includes: forming a second photoresist layer 14 on the metal barrier layer 50 at a position aligned to the bump 30; etching away the metal barrier layer 50 at the position not covered by the photoresist layer 14; removing the second photoresist layer, fill the storage cavity 51 with solder to form a second solder layer 60, wherein the first solder layer 40 is in contact with the second solder layer 60, and the barrier layer 50 is partly located in the second solder layer 60; and removing the second mask layer 13.

In one embodiment, after the metal barrier layer 50 is formed, the manufacturing method further includes: forming a third photoresist layer on the metal barrier layer 50 at locations not aligned to the bump 30; and filling solder in the storage cavity 51 to form the second solder layer 60, wherein the first solder layer 40 is in contact with the second solder layer 60, and one part of the metal barrier layer 50 is located in the second solder layer 60; removing the third photoresist layer; etching the the metal barrier layer 50 at the position not covered by the solder material; removing the second mask layer.

In an embodiment, specific steps of the method for manufacturing a semiconductor structure include the following.

Figure 9:
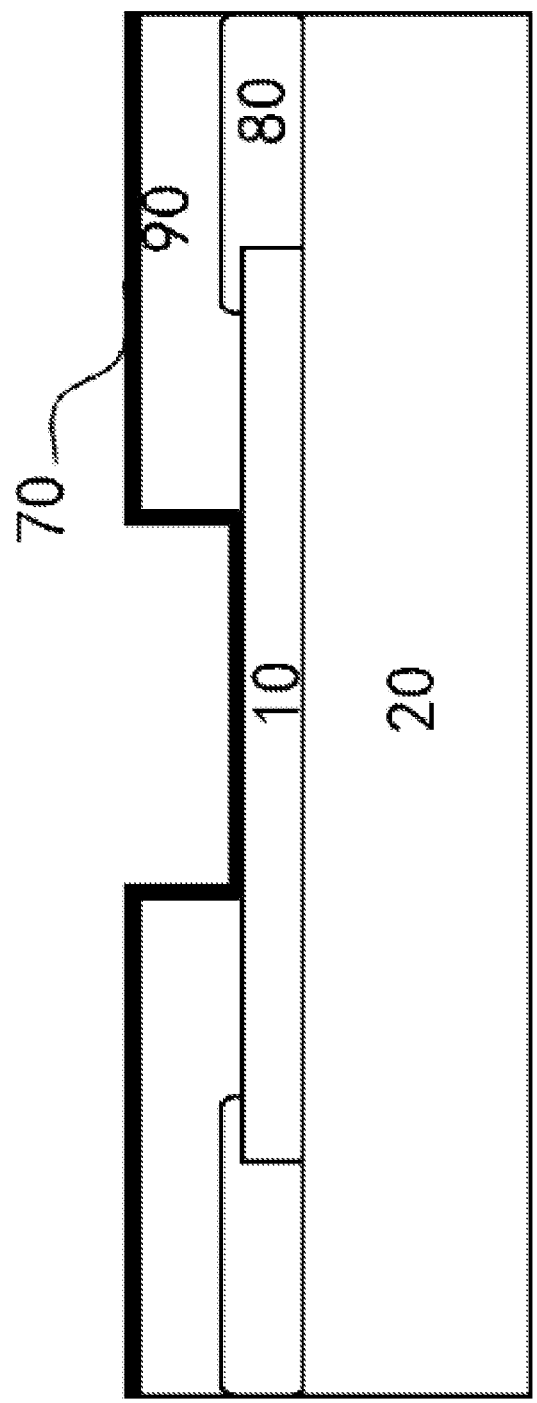
FIG. 9 shows a schematic diagram after forming an under-bump metal layer as an intermediate step in manufacturing the semiconductor chip according to an exemplary embodiment.

As shown in FIG. 9, a first protective layer 80 is formed on the metal pad 10, and a second protective layer 90 is formed on the upper surface of the first protective layer 80 and the metal pad 10 by a deposition process. An opening is formed in the protective layer 90 to prepare for the bump 30, and a metal material is deposited on the metal pad 10 and the second protective layer 90 to form an under-bump metal layer 70, where the under-bump metal layer 70 covers the entire first protective layer 90 and also the opening of the second protective layer 90. The material of the first protective layer 80 may be one of or a combination of silicon dioxide and silicon nitride, and the material of the second protective layer 90 may be polyimide. The metal material layer of the under-bump metal layer 70 may include a Ti layer, a TiW layer, and a Cu layer. The under-bump metal layer 70 is formed on the metal pad 10 and the second protective layer 90 by a physical vapor deposition (PVD) technique. The Ti layer of the under-bump metal layer 70 adheres to and prevents the metal copper from diffusing into the semiconductor substrate 20 and the metal pad 10, and the Cu layer of the under-bump metal layer 70 will form the electroplated copper pillar (bump 30).

Figure 10:
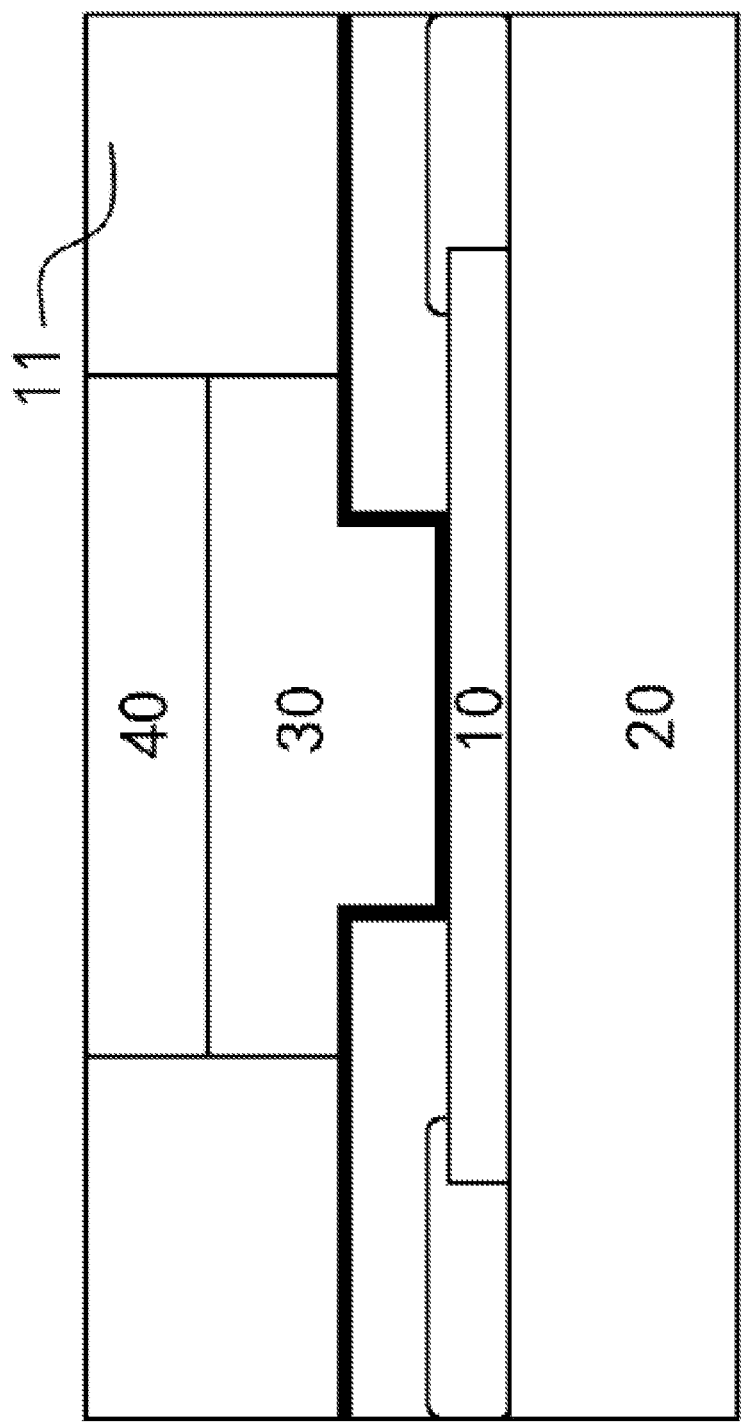
FIG. 10 shows a schematic diagram after forming a first solder layer as an intermediate step in manufacturing the semiconductor chip according to an exemplary embodiment.

As shown in FIG. 10, the first photoresist layer 11 is formed on the second protective layer 90 outside of the areas aligned to the bump 30 and the first solder layer 40, that is, the first photoresist layer 11 leaves the middle uncoated for the bump 30 and the first solder layer 40. The first photoresist layer 11 is a photosensitive layer. After the photoresist layer is coated, it is exposed and developed to form a space for filling with electroplated bump 30 and the first solder layer 40. The material of the first solder layer 40 may be one of lead, tin, and silver or an alloy containing any one of the foregoing solder metals. The material of the first solder layer 40 may be an alloy with a tin content of 91.5% to 98.5% and a silver content of 8.5% to 1.5%. Optionally, the material of the first solder layer 40 may be an alloy with a tin content of 93.2% to 96.5% and a silver content of 6.8% to 3.5%, or the material of the first solder layer 40 may be an alloy with a tin content of 98.2% to 98.5% and a silver content of 1.8%~1.5%, and the bump 30 is a copper pillar.

Figure 11:
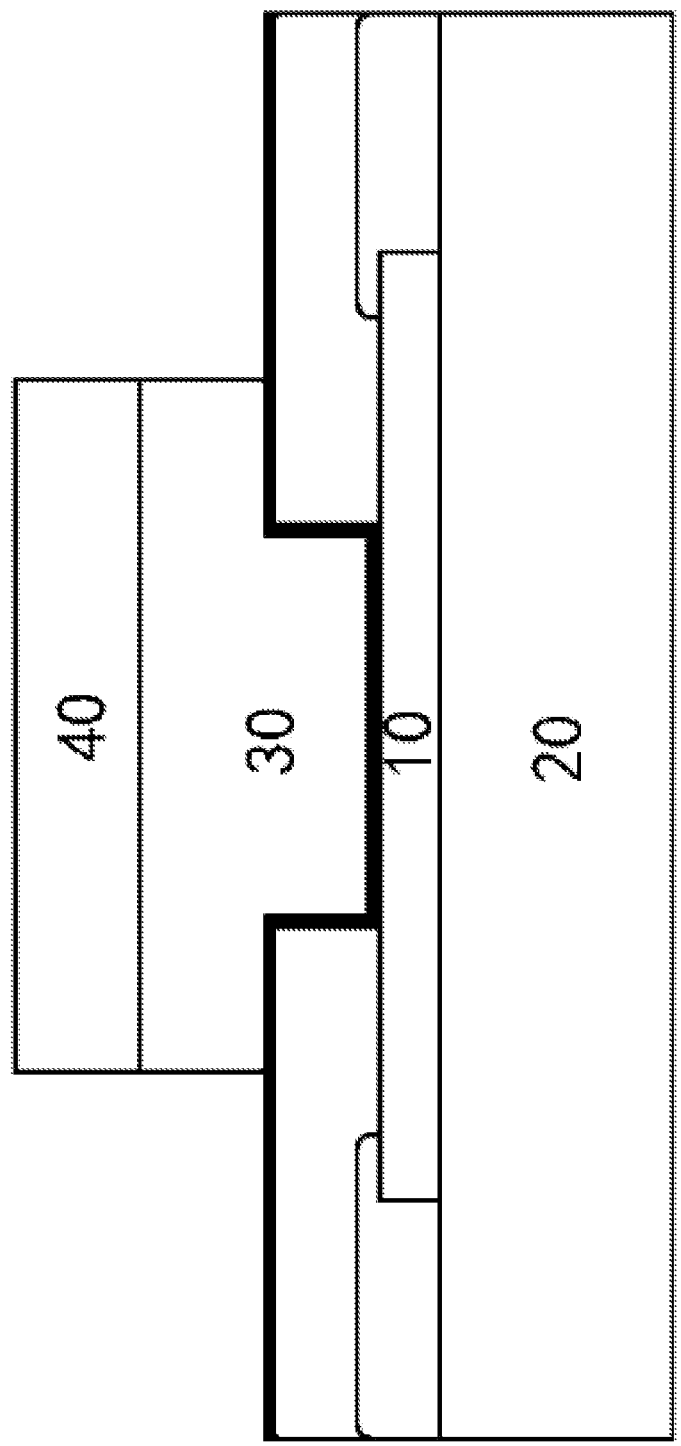
FIG. 11 is a schematic diagram showing a structure after removing the first photoresist layer as an intermediate step in manufacturing the semiconductor chip according to an exemplary embodiment.

As shown in FIG. 11, the first photoresist layer 11 is removed after the electroplated bump 30 and the first solder layer 40 are formed.

Figure 12:
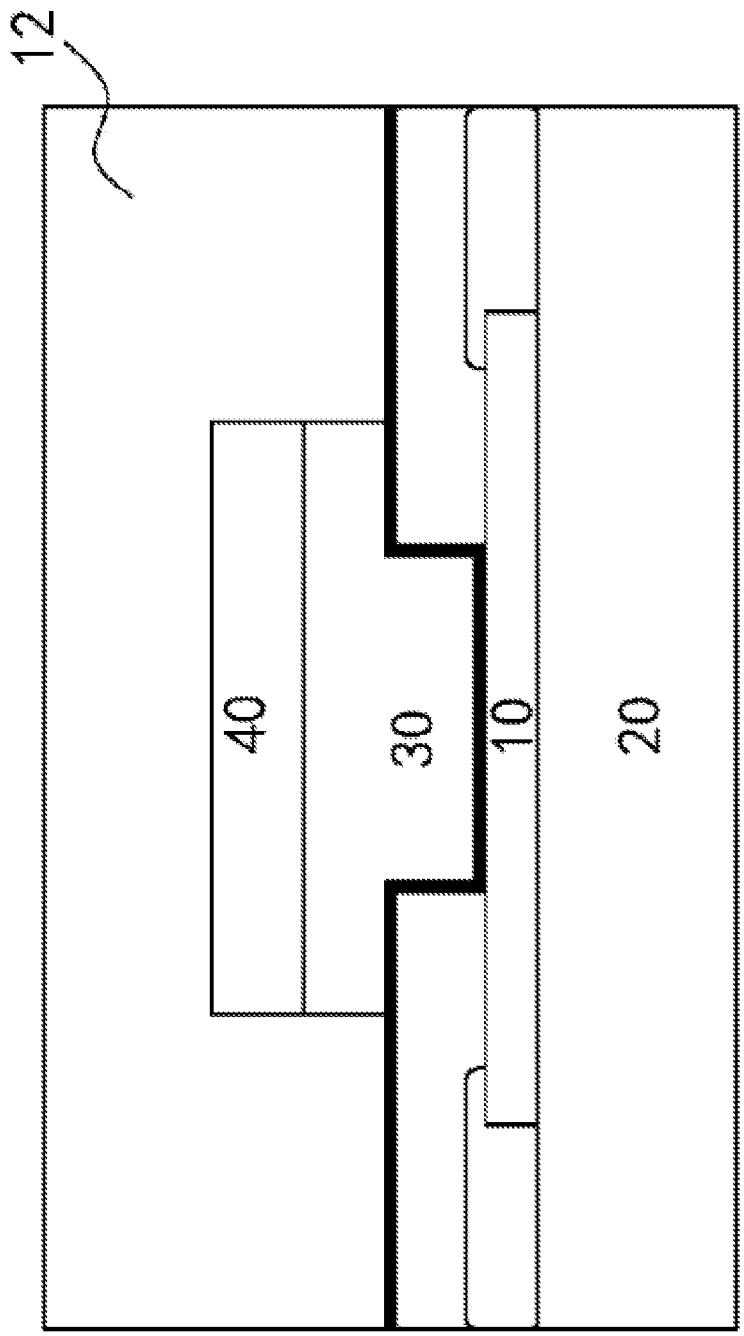
FIG. 12 is a schematic diagram showing a structure after forming a first mask layer as an intermediate stop in manufacturing the semiconductor chip according to an exemplary embodiment.

As shown in FIG. 12, a first musk layer 12 is formed on the semiconductor substrate 20 on the side of the first solder layer 40. The first mask layer 12 covers the first solder layer 40 and the under-bump metal layer 70. Where, the first mask layer 12 may be a polyimide layer.

Figure 13:
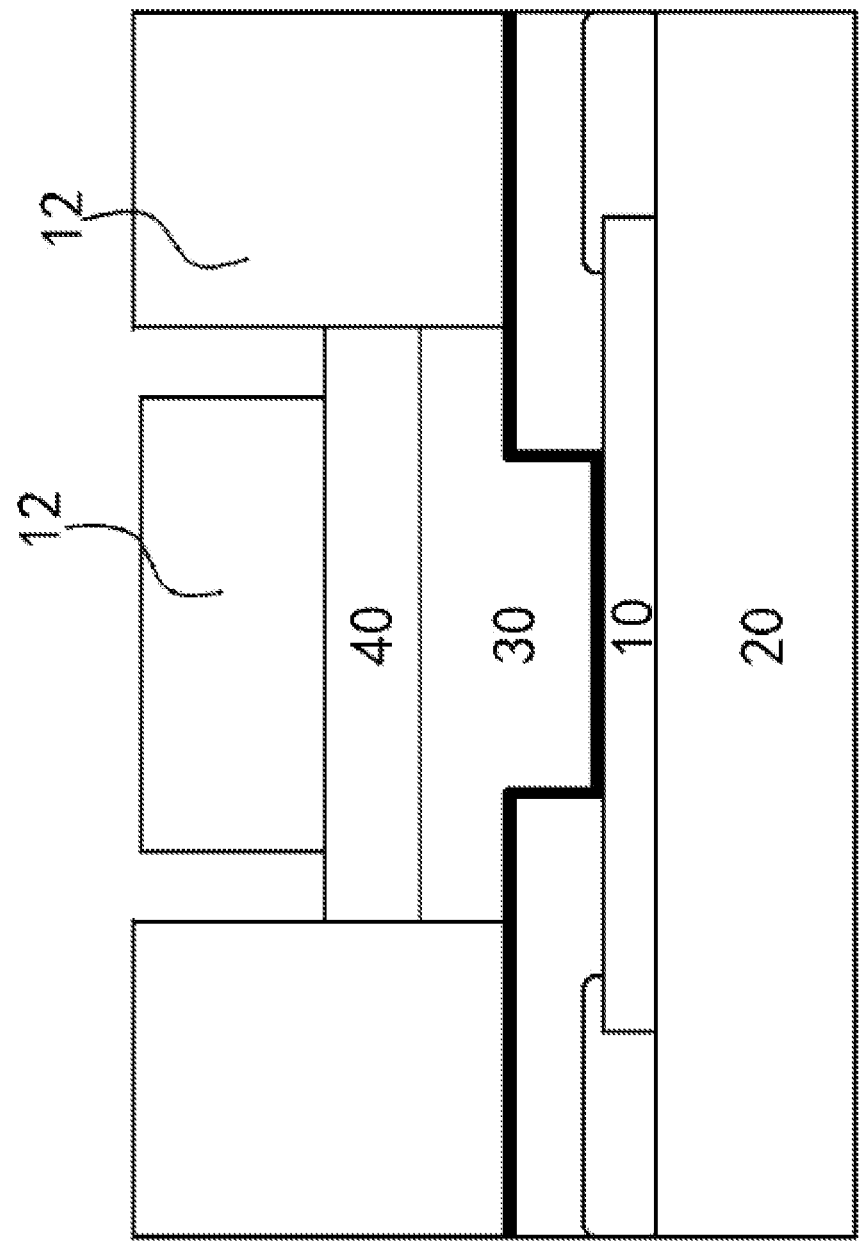
FIG. 13 is a schematic diagram showing a structure after photolithography on a first mask layer as an intermediate step in manufacturing the semiconductor chip according to an exemplary embodiment.

As shown in FIG. 13, the first mask layer 12 is lithographically patterned to expose part of the top surface of the first solder layer 40.

Figure 14:
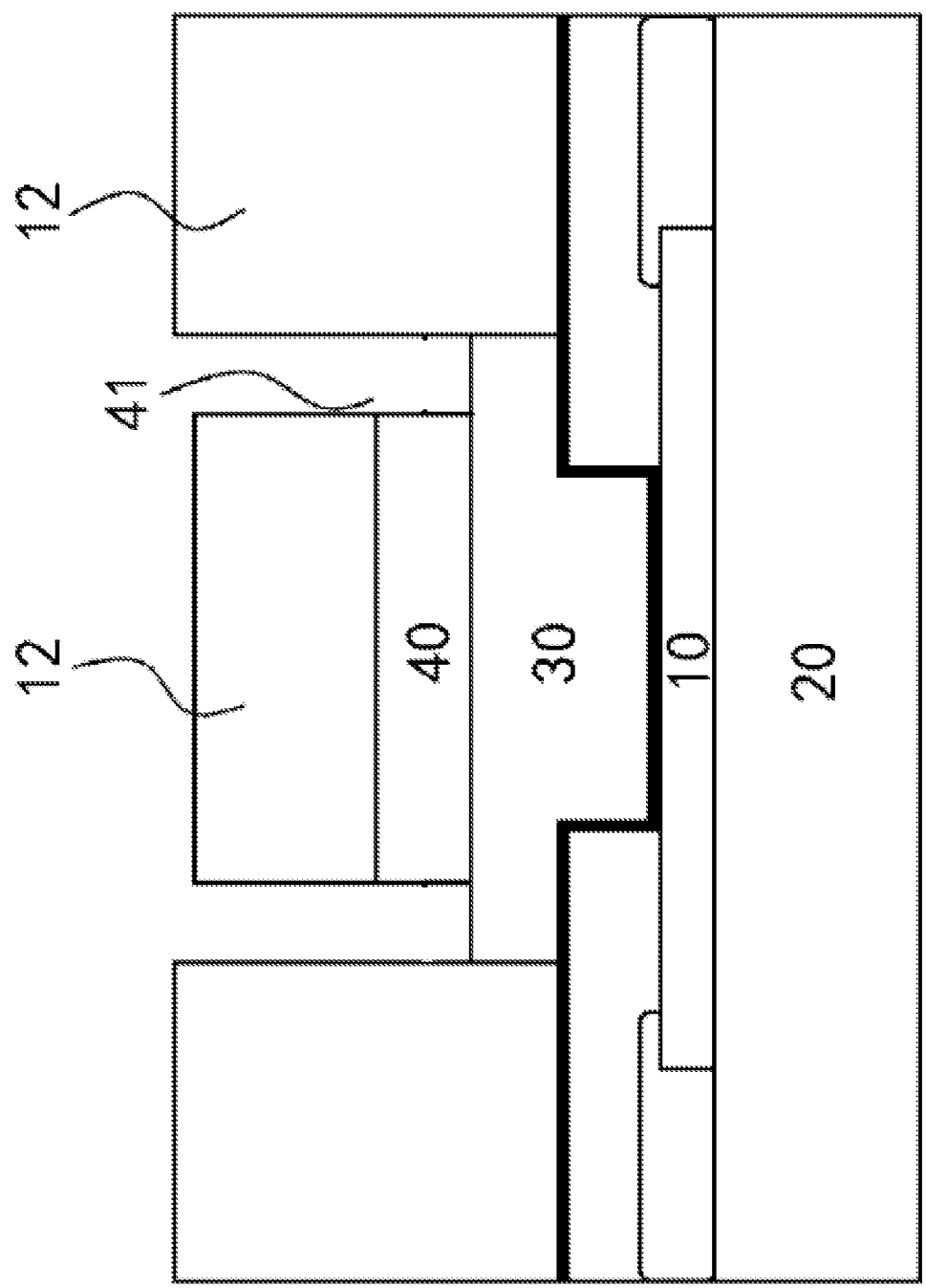
FIG. 14 is a schematic diagram of a structure after the first mask layer is etched as an intermediate step in manufacturing the semiconductor chip according to an exemplary embodiment.

As shown in FIG. 14, the first solder layer 40 is etched by chemical acid etching and the bump 30 is exposed to form a removed space 41.

Figure 15:
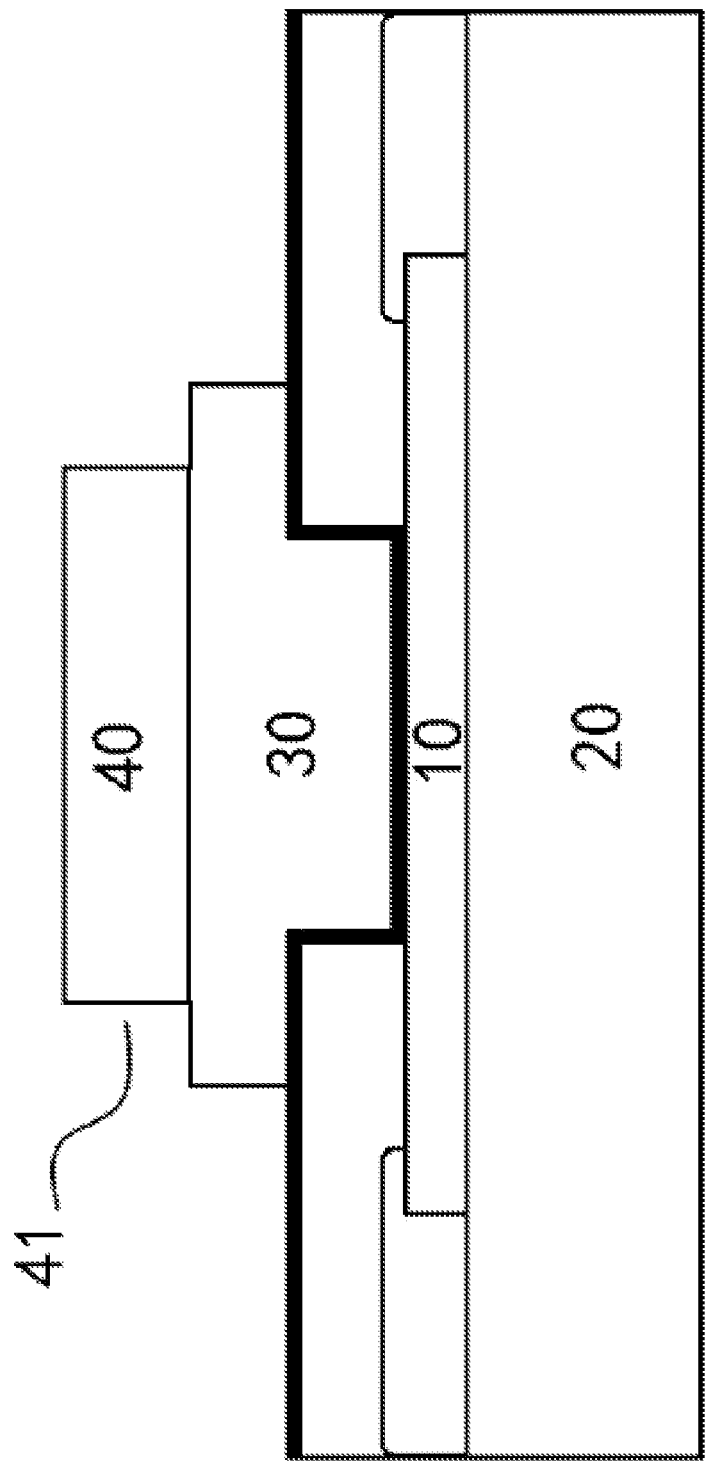
FIG. 15 is a schematic diagram showing a structure after removing the first mask layer as an intermediate step in manufacturing the semiconductor chip according to an exemplary embodiment.

As shown in FIG. 15, the first mask layer 12 is removed.

Figure 16:
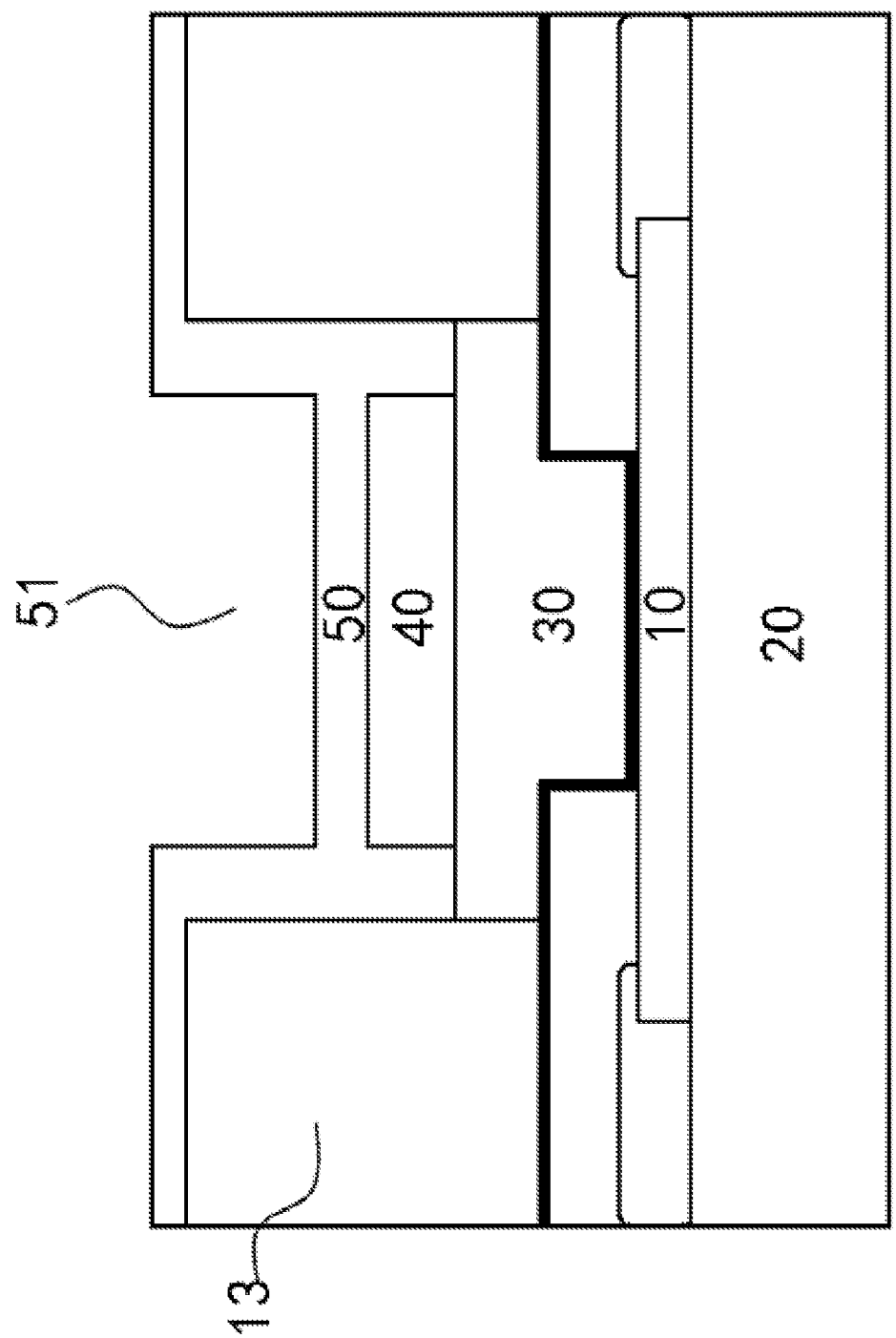
FIG. 16 is a schematic diagram showing a structure after forming a metal barrier layer as an intermediate step in manufacturing the semiconductor chip according to an exemplary embodiment.

As shown in FIG. 16, the second mask layer 13 is formed to cover the first solder layer 40, the bump 30 and the under-bump metal layer 70, and the second mask layer 13 is lithographically patterned to expose the first solder layer 40 and part of the bump 30, a physical vapor deposition (PVD) process is applied to deposit the metal barrier layer 50 above the second mask layer 13 and the first solder layer 40. Here the metal barrier layer 50 may be a nickel layer, and when a thicker metal barrier layer 50 is needed, an electroplating process is used to increase the nickel layer thickness. Here the second mask layer 13 may be a polyimide layer.

Figure 17:
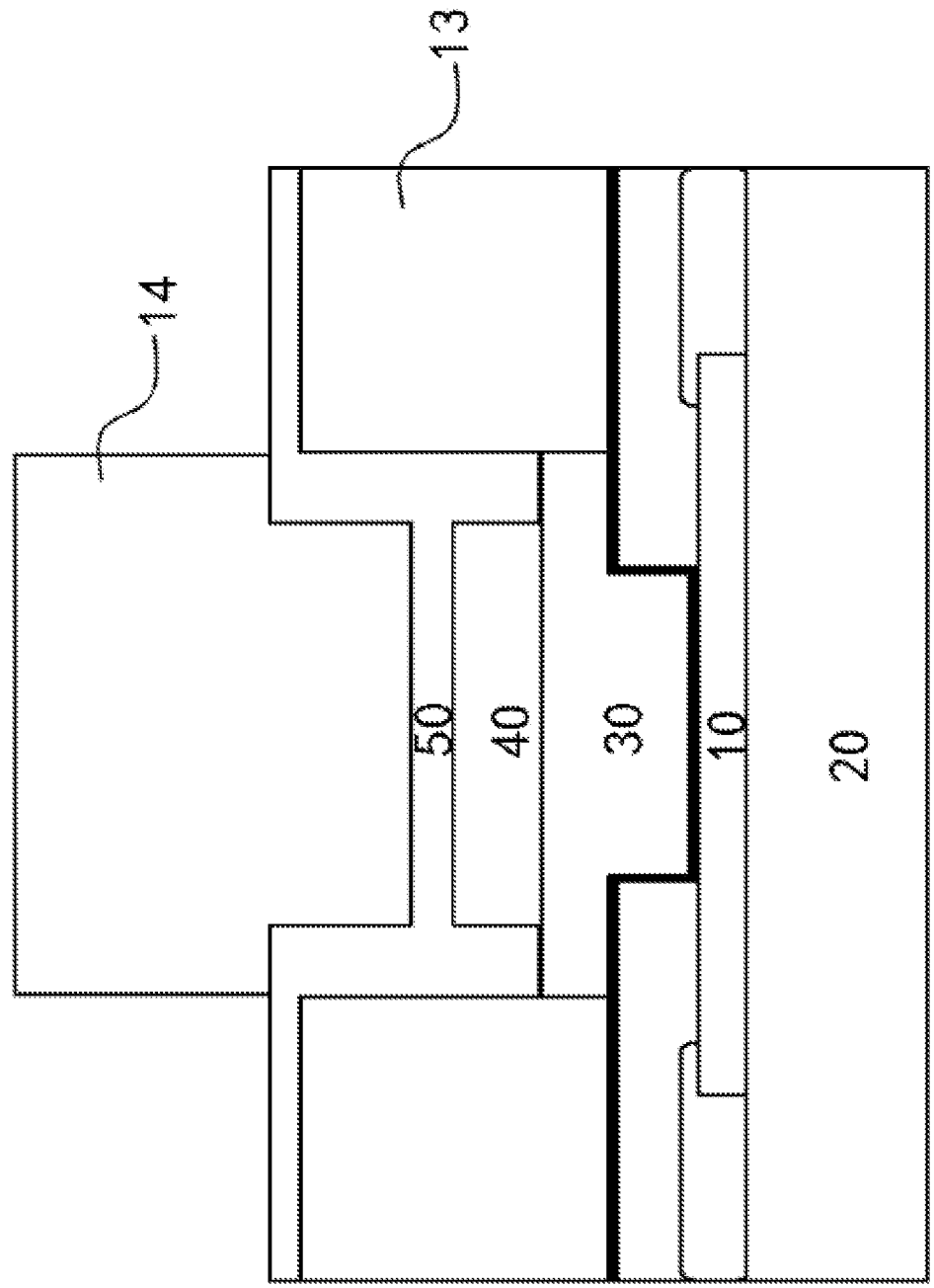
FIG. 17 is a schematic diagram showing a structure after forming a second photoresist layer as an intermediate step in manufacturing the semiconductor chip according to an exemplary embodiment.

As shown in FIG. 17, a second photoresist layer 14 is formed on the metal barrier layer 50 in an area aligned to the first solder layer 40. Herein, the second photoresist layer 14 is disposed over the first solder layer 40 and works as a photolithography mask for the metal barrier layer 50, and the second photoresist layer 14 is a photosensitive layer.

Figure 18:
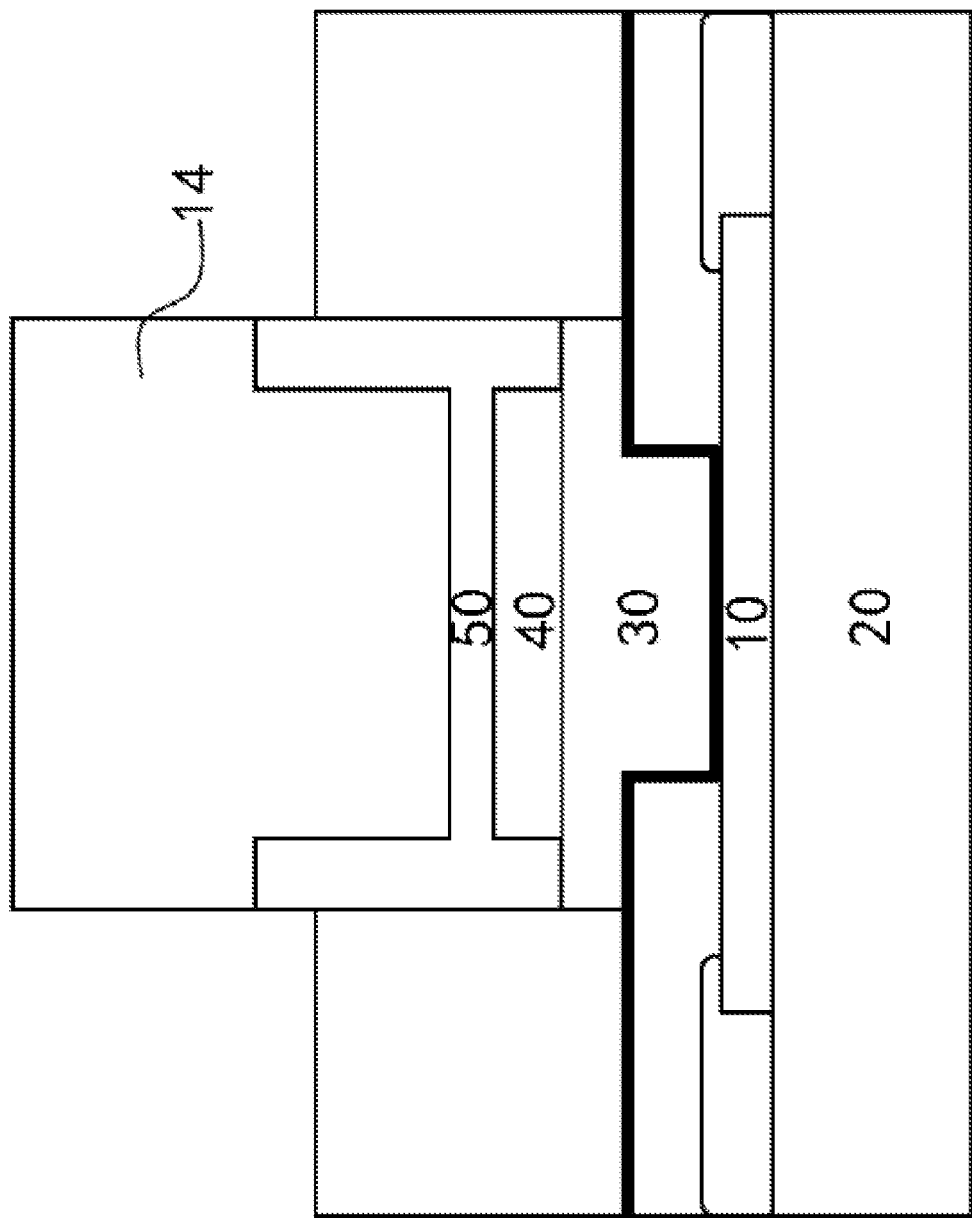
FIG. 18 is a schematic diagram of a structure after etching a metal barrier layer as an intermediate step in manufacturing the semiconductor chip according to an exemplary embodiment.

As shown in FIG. 18, the metal material of the metal barrier layer 50 not covered by the second photoresist layer 14 is etched.

Figure 19:
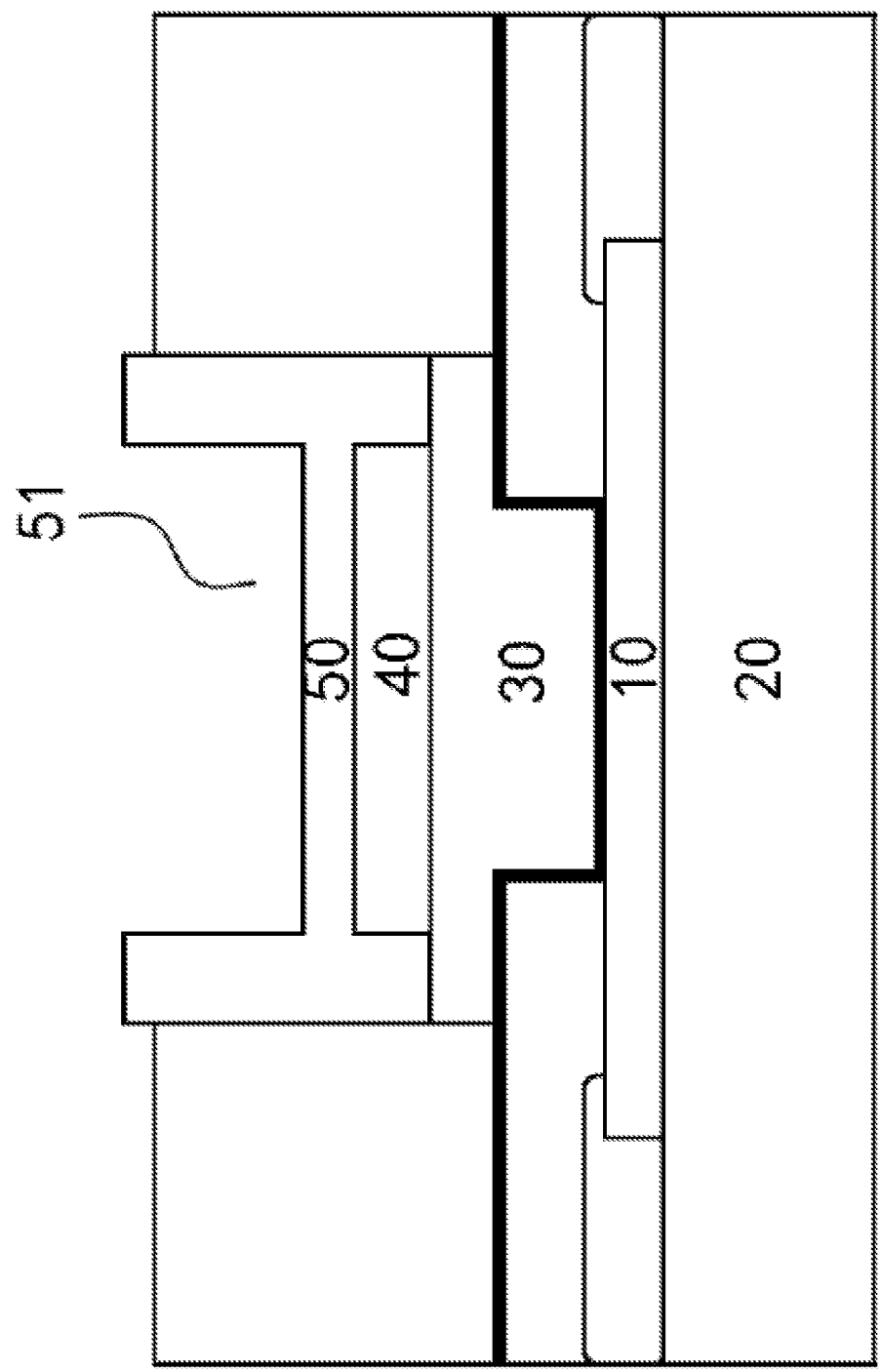
FIG. 19 is a schematic diagram showing a structure after removing the second photoresist layer as an intermediate step in manufacturing the semiconductor chip according to an exemplary embodiment.

As shown in FIG. 19, the second photoresist layer 14 is removed to expose the storage cavity 51 on the metal barrier layer 50.

Figure 20:
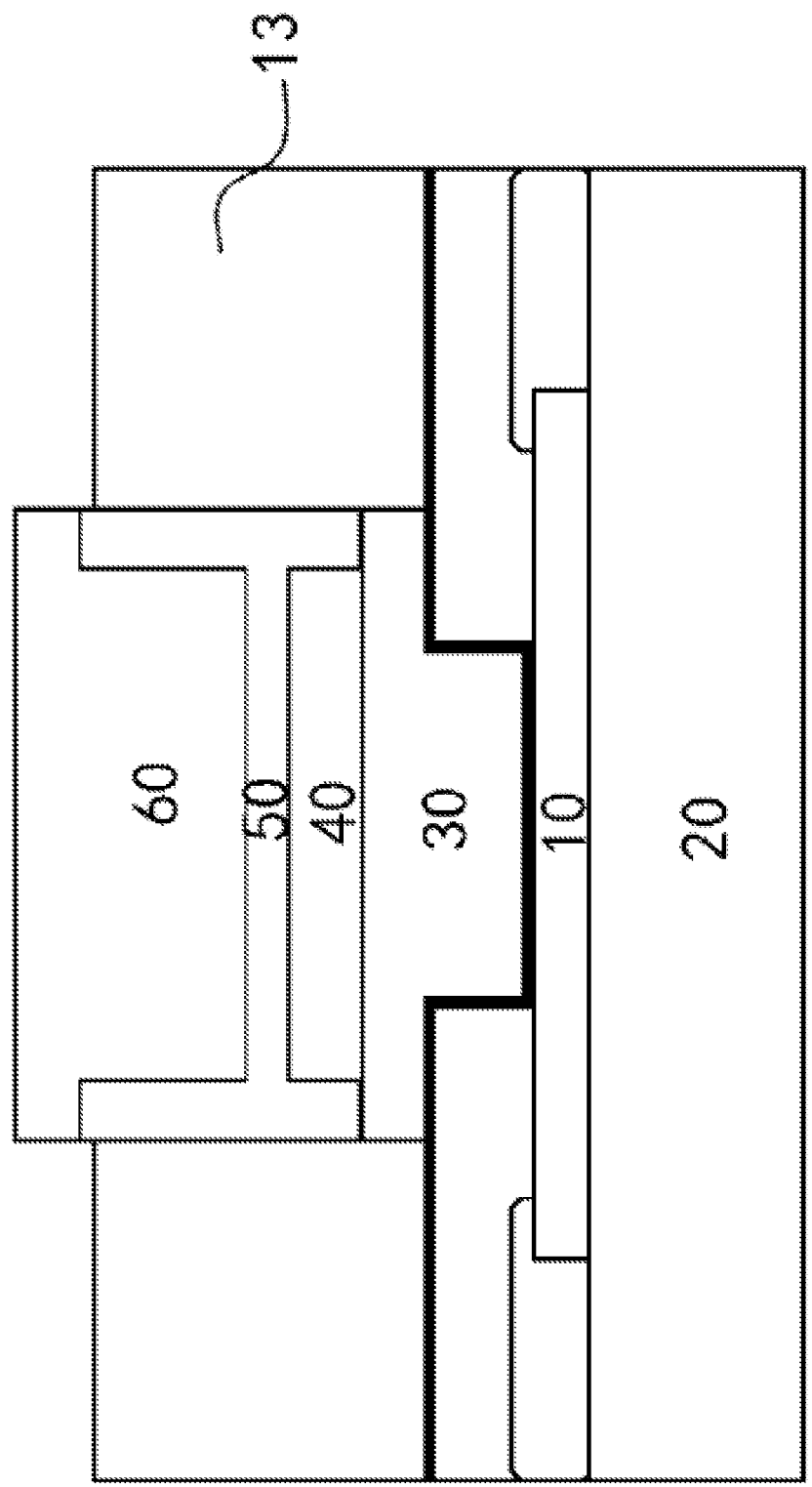
FIG. 20 is a schematic diagram showing a structure after forming a second solder layer as an intermediate step in manufacturing the semiconductor chip according to an exemplary embodiment.

As shown in FIG. 20, the storage cavity 51 is filled with solder to form a second solder layer 60. The top surface of the second solder layer 60 is higher than the top surface of the metal barrier layer 50. The second solder layer 60 and the first solder layer 40 are in contact. Herein, the material of the second solder layer 60 may be one of lead, tin and silver or an alloy containing any one of the foregoing solder metals. For example, the material of the second solder layer 60 may be an alloy with a tin content of 91.5% to 98.5% and a silver content of 8.5% to 1.5%. Optionally, the material of the second solder layer 60 may be an alloy with a tin content of 93.2% to 96.5% and a silver content of 6.8% to 3.5%, and the material of the second solder layer 60 may be an alloy with a tin content of 98.2% to 98.5%, and silver content of 1.8% to 1.5%.

Figure 21:
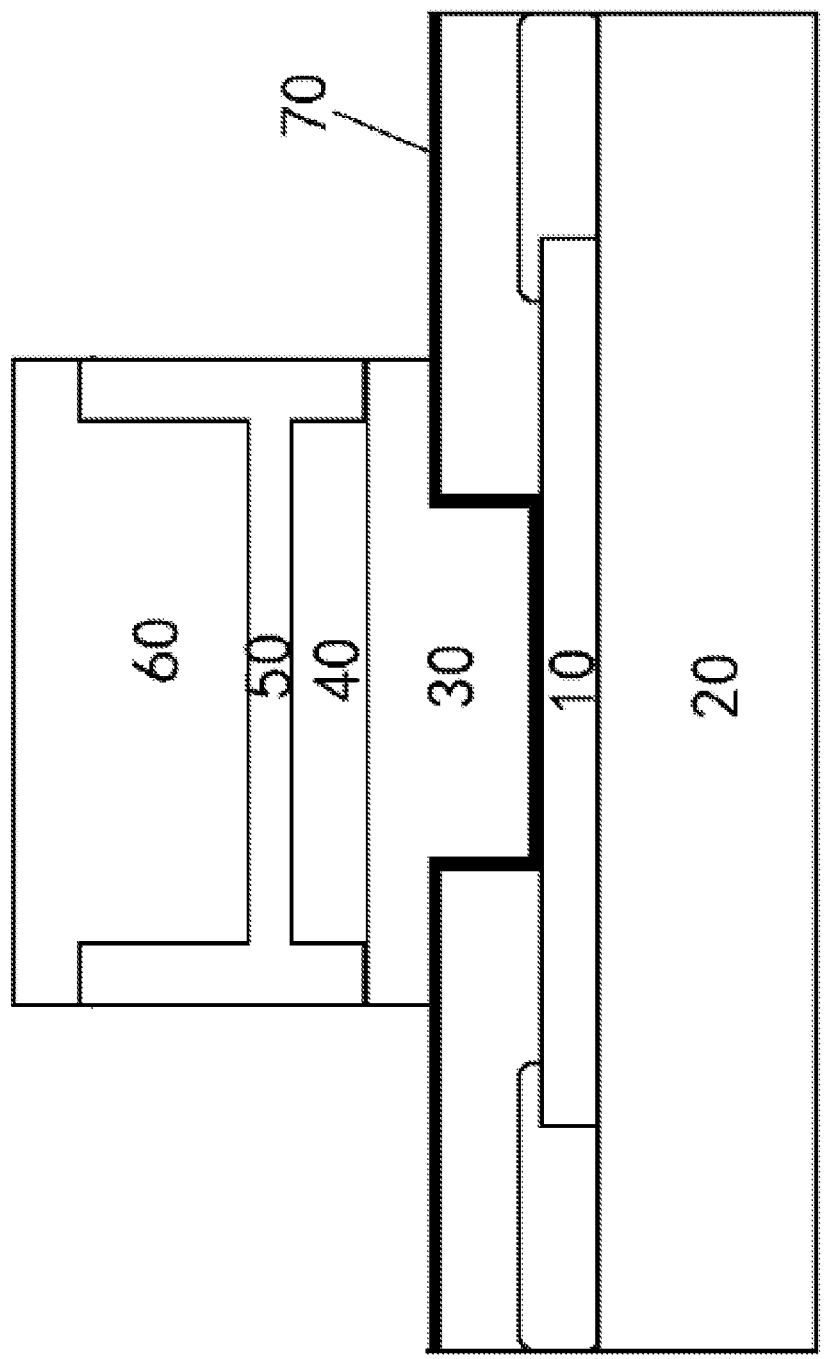
FIG. 21 is a schematic diagram of a structure after etching a second mask layer as a step in manufacturing the semiconductor chip according to an exemplary embodiment.

As shown in FIG. 21, the second mask layer 13 is etched. Then, the under-bump metal layer 70 is also etched. Finally a high-temperature reflow process forms solder bumps on the surface of the metal barrier layer 50, completing the semiconductor structure similar to those shown in FIG. 1.

In another embodiment, specific steps of a method for manufacturing a semiconductor structure include:

After the preparation process disclosed in FIGS. 9 to 16 is completed, a metal barrier layer 50 is deposited on the second mask layer 13 and the first solder layer 40 by applying the physical vapor deposition (PVD) technology.

A third photoresist layer is formed on the material of the metal barrier layer 50 on areas not aligned to the first solder layer 40. Herein, the third photoresist layer may be a photosensitive layer.

The storage cavity 51 is filled with solder to form a second solder layer 60. The top surface of the second solder layer 60 is higher than that of the metal barrier layer 50 but lower than that of the third photoresist layer. Herein, the material of the solder layer may be one of lead, tin, and silver or an alloy containing any one of the foregoing solder metals. For example, the material of the second solder layer 60 may be an alloy with a tin content of 91.5% to 98.5% and a silver content of 8.5% to 1.5%. Optionally, the material of the second solder layer 60 may be an alloy with a tin content of 93.2% to 96.5% and a silver content of 6.8% to 3.5%, and the material of the second solder layer 60 may also be an alloy with a tin content of 98.2% to 98.5%, and a silver content of 1.8% to 1.5%.

The third photoresist layer is then removed.

The second mask layer 13 is etched. Then, the under-bump metal layer 70 is etched as well. Finally a high-temperature reflow process is used to form solder bumps on the surface of the metal barrier layer 50 to complete the semiconductor structure shown in FIG. 1.

Those skilled in the art will easily think of other embodiments of the present invention after considering the description and practicing the invention disclosed herein. The present invention is intended to cover any variations, uses or adaptive changes of the present invention. These variations, uses or adaptive changes follow the general principles of the present invention and include common knowledge or conventional technical means in the technical field not disclosed by the present invention. The specification and example embodiments are to be regarded as exemplary only, and the true scope and spirit of the present invention are pointed out by the following claims.

It should be understood that the present invention is not limited to the precise structure described above and shown in the drawings, and various modifications and changes can be made without departing from its scope. The scope of the present invention is only limited by the appended claims.

The invention claimed is:

1. A semiconductor structure, comprising:
   a semiconductor substrate;
   a metal pad disposed on the semiconductor substrate;
   a bump disposed on the metal pad;
   a metal barrier layer disposed on a side of the bump away from the metal pad, wherein the metal barrier layer comprises a storage cavity and at least one opening, wherein the at least one opening is placed on a side wall of the metal barrier layer, and wherein the at least one opening is connected to the storage cavity;
   a solder layer disposed in the storage cavity, wherein one side of the solder layer away from the bump protrudes from the storage cavity;
   side wall segments, wherein the side wall segments are arranged in pairs, wherein pairs of the side wall segments are arranged to be apart from each other on the bump, and wherein two openings are formed between two oppositely placed side wall segments; and
   a connecting section, wherein both ends of the connecting section are respectively connected to the two oppositely placed side wall sections.

2. The semiconductor structure of claim 1, wherein the storage cavity is a through hole so that the solder layer is in contact with the bump.

3. The semiconductor structure of claim 1, wherein the at least one opening extends along a length of the metal barrier layer and intersects both ends of the metal barrier layer.

4. The semiconductor structure of claim 1, wherein the at least one opening comprises multiple openings, and wherein the multiple openings are spaced apart with an interval from each other.

5. The semiconductor structure of claim 1, wherein the connecting section connects to a middle part of each of the two oppositely placed sidewall sections.

6. The semiconductor structure of claim 5, wherein the solder layer comprises:
   a first solder layer, wherein the first solder layer is disposed on the bump and located below the connecting section; and
   a second solder layer, wherein the second solder layer is disposed on the first solder layer, wherein a side of the second solder layer away from the first solder layer protrudes from the storage cavity;
   wherein the second solder layer is in contact with the first solder layer, and wherein the connecting section of the metal barrier layer is located between the first solder layer and the second solder layer.

7. The semiconductor structure according to claim 1, wherein the solder layer is disposed in the opening.

8. The semiconductor structure according to claim 1, wherein the bump is a copper pillar, and wherein the semiconductor structure further comprises: an under-bump metal layer, at least a part of the under-bump metal layer is sandwiched between the metal pad and the bump.

9. The semiconductor structure of claim 8, wherein the semiconductor structure further comprises:
   a first protection layer disposed on the semiconductor substrate, wherein the first protection layer has a first opening, and wherein the first opening exposes a part of the metal pad.

10. The semiconductor structure of claim 9, wherein the semiconductor structure further comprises:
    a second protective layer disposed on the first protective layer, wherein the second protective layer comprises a second opening, and wherein a size of the second opening is smaller than or equal to a size of the first opening;
    wherein the under-bump metal layer at least covers a bottom surface and a sidewall surface of the second opening, and wherein at least part of the under-bump metal layer is disposed in the second opening.

11. A method of manufacturing a semiconductor structure, comprising:
    providing a semiconductor substrate, and forming a metal pad on the semiconductor substrate;
    forming a bump on the metal pad; and
    forming a solder layer and a metal barrier layer on a side of the bump away from the metal pad;
    wherein the metal barrier layer comprises a storage cavity, wherein a side wall of the metal barrier layer is provided with an opening, wherein the opening connects to the storage cavity, wherein the solder layer is disposed in the storage cavity, and wherein one surface of the solder layer away from the bump protrudes from the storage cavity; and
    wherein the solder layer comprises a first solder layer and a second solder layer, wherein a method forming the first solder layer and the second solder layer comprises:
    forming the first solder layer on a side of the bump away from the metal pad; and
    forming the metal barrier layer on the first solder layer and the bumps; and
    forming the second solder layer in the storage cavity.

12. The manufacturing method of claim 11, wherein before forming the bump, the manufacturing method further comprises:
    forming an under-bump metal layer on the metal pad;
    wherein, at least part of the under-bump metal layer is sandwiched between the metal pad and the bump.

13. The manufacturing method of claim 12, wherein before forming the bump, the manufacturing method further comprises:
    forming a first protective layer on the semiconductor substrate;
    wherein the first protection layer comprises a first opening, and wherein the first opening exposes a part of the metal pad.

14. The manufacturing method of claim 13, wherein after forming the first protective layer, the manufacturing method further comprises:
    forming a second protective layer on the upper surface of the first protective layer and the metal pad; and
    after forming the second protection layer, forming the under-bump metal layer on the metal pad and the second protection layer;
    wherein the second protective layer comprises a second opening, wherein a size of the second opening is smaller than or equal to a size of the first opening, wherein the under-bump metal layer covers at least a bottom surface and a sidewall surface of the second opening, and wherein at least a part of the under-bump metal layer is disposed in the second opening.

15. The manufacturing method according to claim 11, wherein before forming the bump, the manufacturing method further comprises:
    forming a first photoresist layer on the semiconductor substrate in an area not aligned to the bump and the first solder layer; and
    after forming the bump and the first solder layer, removing the first photoresist layer.

16. The manufacturing method according to claim 11, further comprising, before forming the metal barrier layer:
    forming a first mask layer on a side of the semiconductor substrate wherein the first solder layer is formed;
    applying a photolithography process to pattern the first mask layer to expose a part of the first solder layer;
    etching the first solder layer with a chemical acid etching process to expose the bump;
    removing the first mask layer;
    forming a second mask layer; and
    applying a photolithography process to pattern the second mask layer to expose the first solder layer and a part of the bump, and disposing the metal barrier layer on the first solder layer, the bump, and the second mask layer, wherein the metal barrier layer covers a portion of the first solder layer.

17. The manufacturing method according to claim 16, further comprising, after forming the metal barrier layer:
    forming a second photoresist layer on the metal barrier layer in an area aligned to the bump;
    patterning the metal barrier layer in an area not covered by the second photoresist layer;
    removing the second photoresist layer;
    filling the storage cavity with solder to form the second solder layer, wherein the first solder layer is in contact with the second solder layer, and wherein the metal barrier layer is disposed in the second solder layer; and
    removing the second mask layer.

18. The manufacturing method of claim 16, further comprising, after forming the metal barrier layer:
- forming a third photoresist layer on the metal barrier layer in an area not aligned to the bump;
- filling the storage cavity with solder to form the second solder layer, wherein the first solder layer is in contact with the second solder layer, and wherein a part of the metal barrier layer is disposed in the second solder layer;
- removing the third photoresist layer;
- etching the metal barrier layer in an area not covered by solder; and
- removing the second mask layer.

\* \* \* \* \*